United States Patent
Uda et al.

(10) Patent No.: US 6,621,207 B2
(45) Date of Patent: Sep. 16, 2003

(54) SUBSTRATE HAVING FINE LINE, ELECTRON SOURCE AND IMAGE DISPLAY APPARATUS

(75) Inventors: Yoshimi Uda, Kanagawa (JP); Kazuya Ishiwata, Kanagawa (JP); Shinsaku Kubo, Kanagawa (JP); Yasuyuki Watanabe, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 67 days.

(21) Appl. No.: 10/014,398

(22) Filed: Dec. 14, 2001

(65) Prior Publication Data
US 2002/0100913 A1 Aug. 1, 2002

(30) Foreign Application Priority Data

Dec. 15, 2000 (JP) ........................................ 2000-382330
Dec. 12, 2001 (JP) ........................................ 2001-379077

(51) Int. Cl.$^7$ ................................................ H01J 1/62
(52) U.S. Cl. ........................ 313/485; 313/285; 313/495
(58) Field of Search ............................. 313/477 R, 495, 313/512, 634, 285, 485

(56) References Cited

U.S. PATENT DOCUMENTS

| 5,839,363 A | 11/1998 | Yanagisawa et al. ....... 101/123 |
| 5,905,335 A | 5/1999 | Fushimi et al. ............. 313/495 |

FOREIGN PATENT DOCUMENTS

| JP | 5-38874 | 5/1993 |
| JP | 8-34110 | 2/1996 |
| JP | 8-315723 | 11/1996 |

*Primary Examiner*—Vip Patel
(74) *Attorney, Agent, or Firm*—Fitzpatrick, Cella, Harper & Scinto

(57) ABSTRACT

As a substrate having a fine line and capable of suppressing crack generation in the substrate and peeling of the fine line, the invention discloses a configuration in which plural recesses are arranged on the fine line, and particularly a configuration in which the interval of the plural recesses does not exceed 200 μm. There is also disclosed a configuration in which the plural recesses are arranged along a direction crossing the longitudinal direction of the fine line.

12 Claims, 19 Drawing Sheets

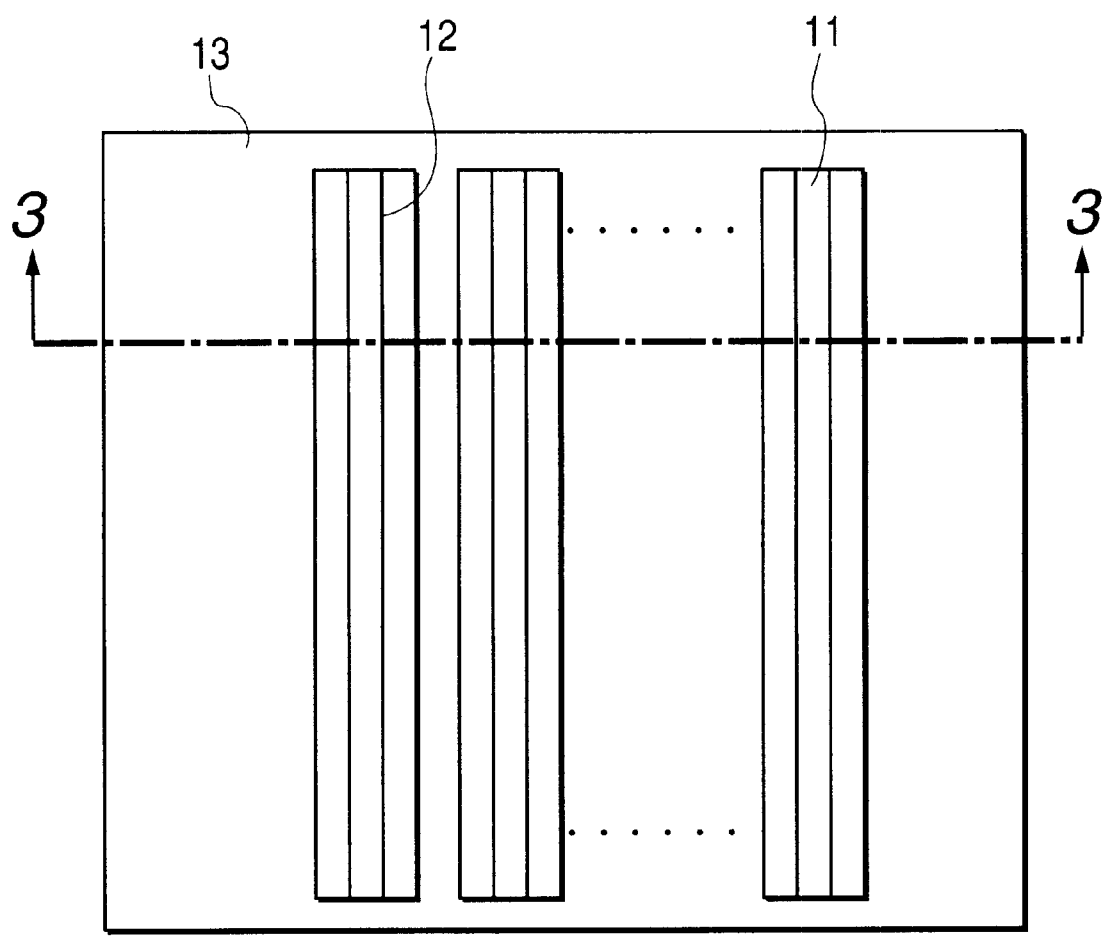

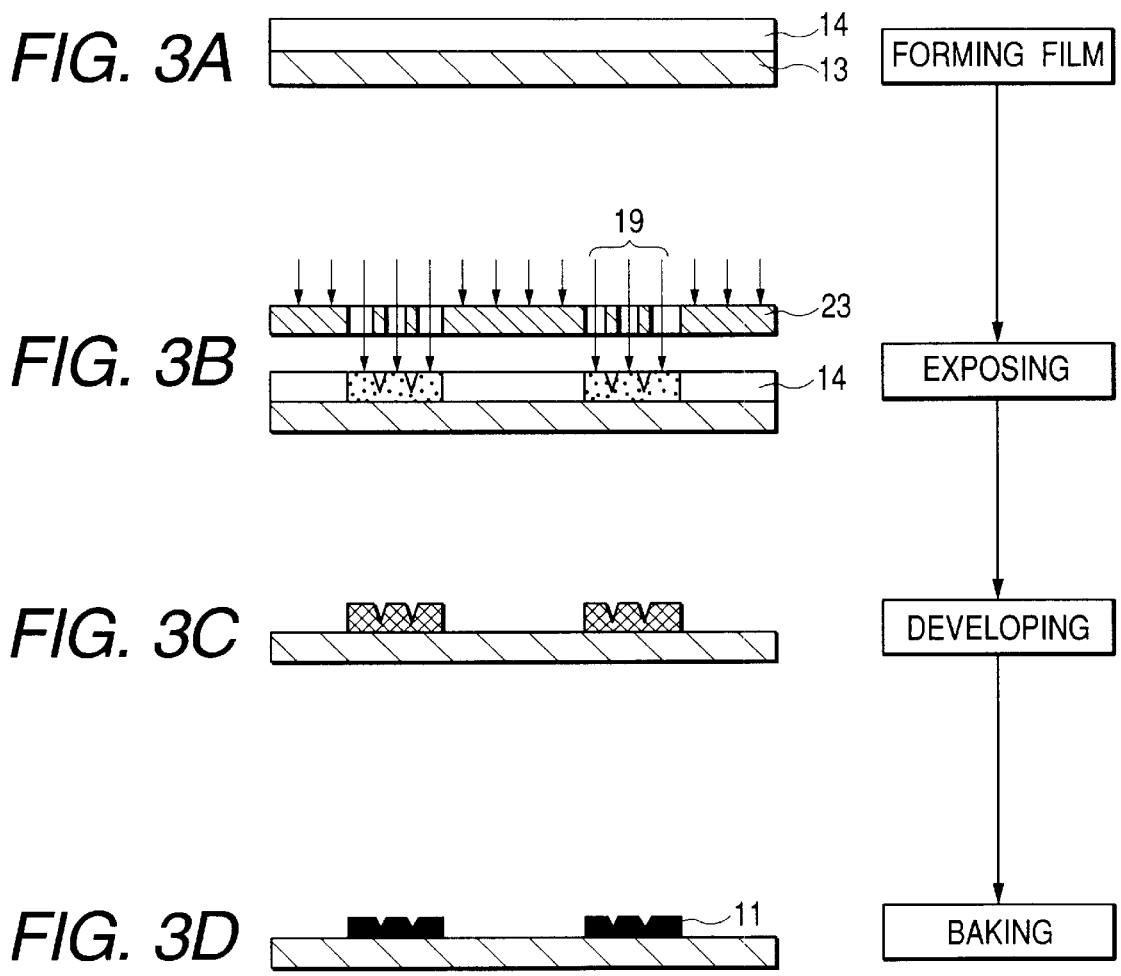

FIG. 10A — FORMING FILM
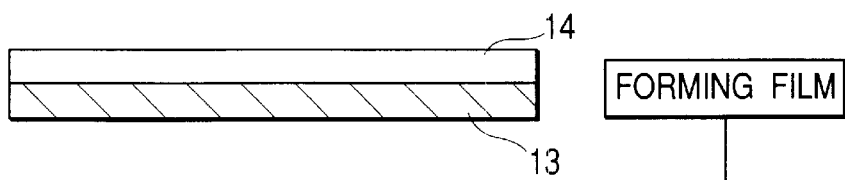
FIG. 10B — EXPOSURE
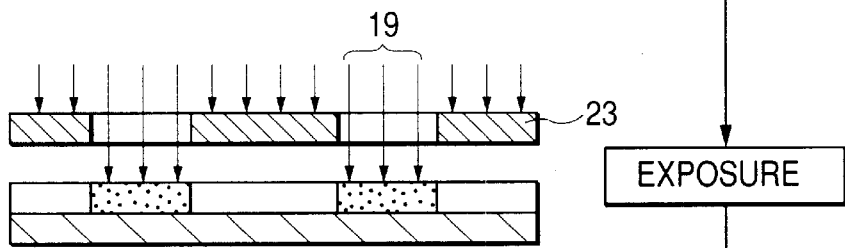
FIG. 10C — FORMING FILM
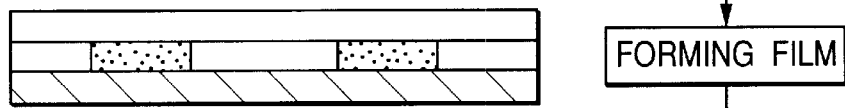
FIG. 10D — EXPOSURE
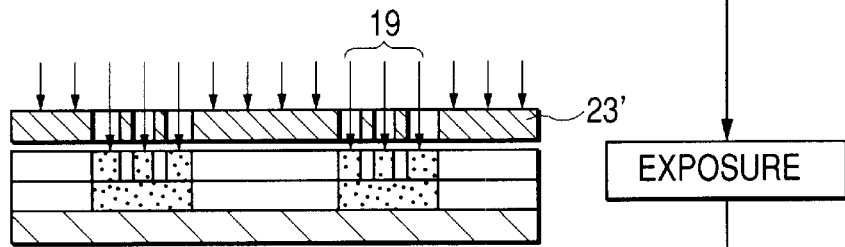
FIG. 10E — DEVELOPING
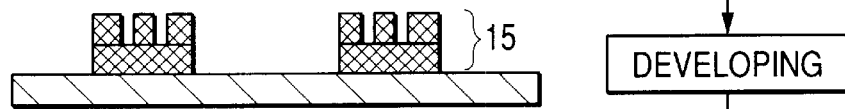
FIG. 10F — BAKING
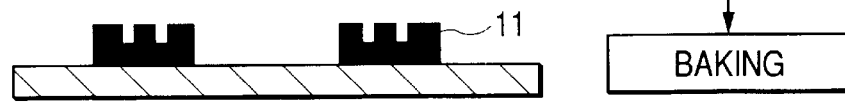

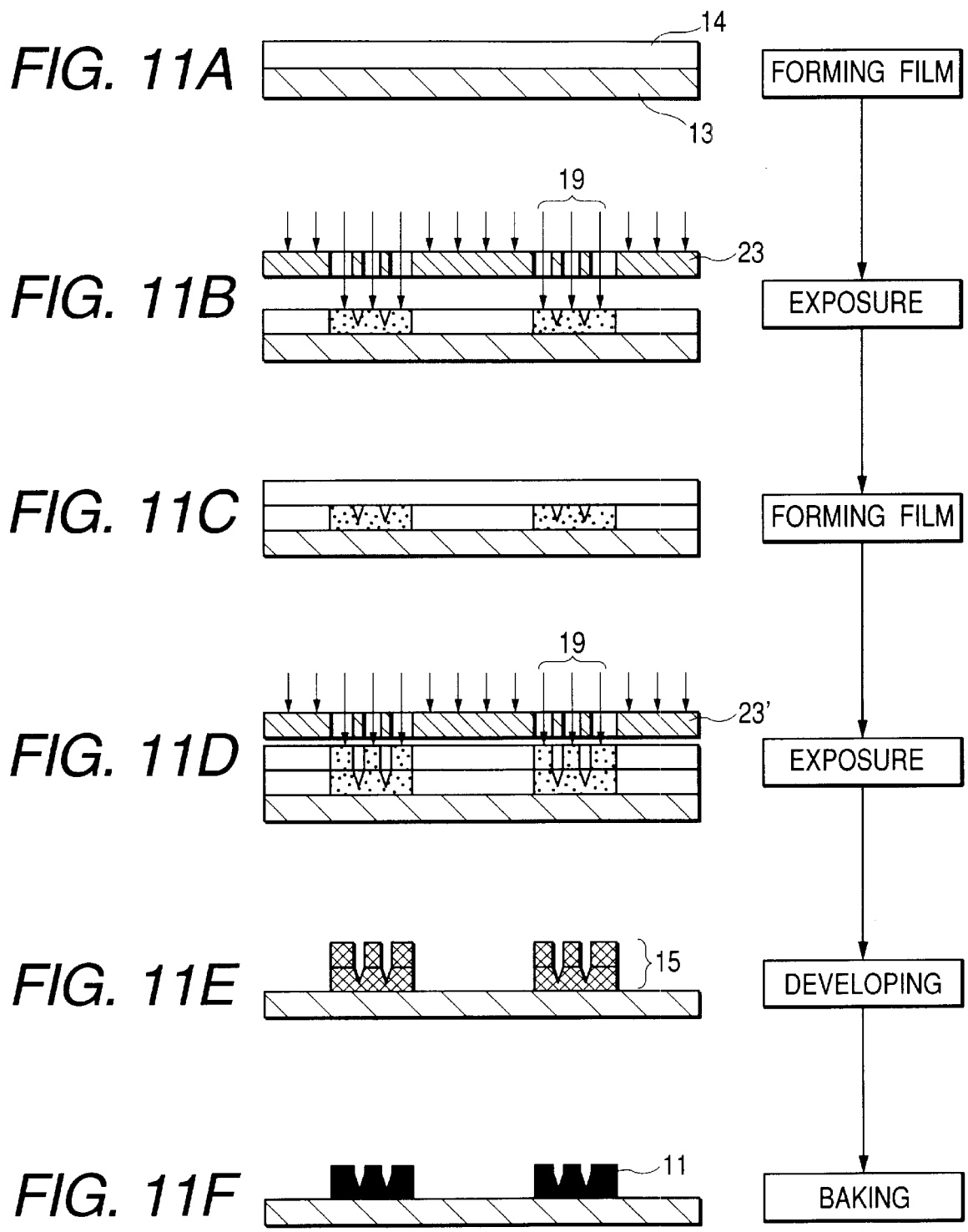

FORMING FILM

EXPOSURE

FORMING FILM

EXPOSURE

DEVELOPING

BAKING

FORMING FILM

EXPOSURE

FORMING FILM

EXPOSURE

DEVELOPING

BAKING

Y-DIRECTION

X-DIRECTION

SUBSTRATE HAVING FINE LINE, ELECTRON SOURCE AND IMAGE DISPLAY APPARATUS

BACKGROUND OF THE INVENTION

1. Field of the Invention

The present invention relates to a substrate having a fine line, an electron beam substrate utilizing the same, and an image display apparatus employing the same.

2. Related Background Art

There are also known configurations in which a fine line is formed on a substrate. The fine line can be, for example, a cell partition wall between light-emitting cells in a plasma display panel, or a wiring (electrode) for driving a device on a substrate.

In the following there will be shown an example of forming a fine line as a wiring in an electron source substrate.

As the electron source, there is for example known a configuration utilizing a surface conduction electron-emitting device. FIGS. 13A and 13B are respectively a schematic plan view of an electron emitting device and a schematic cross-sectional view along a line 13B—13B in FIG. 13A.

As shown in FIGS. 13A and 13B, the electron emitting device is principally composed of an insulating substrate 200, electrodes 2, 3 formed by film formation on the substrate 200, an electron-emitting electroconductive film 7 formed by film formation so as to be electrically connected to the electrodes 2, 3, and an electron-emitting region 8 provided in the electron-emitting electroconductive film 7.

As an application of such electron-emitting device, there is known an image forming apparatus such as a display apparatus. FIG. 14 is a partially broken perspective view of an image forming apparatus (image display apparatus) utilizing the surface conduction electron-emitting device shown in FIGS. 13A and 13B.

As shown in FIG. 14, such image display apparatus is provided with a substrate 81, an outer frame 82 and a face plate 86 on which an image forming member (phosphor) 84 is provided, and such outer frame 82, substrate 81 and face plate 86 are sealed at the connecting portions thereof with an unrepresented adhesive material such as low-melting glass frit to constitute an envelope (hermetic container) 88 for maintaining the interior of the image display apparatus in vacuum state.

On the substrate 81, there is fixed a substrate 200 on which electron-emitting devices are formed. On the substrate 200, electron-emitting devices 74 are formed in a matrix arrange n×m, wherein n and m and positive integers at least equal to 2, and are suitably selected according to the desired number of display pixels.

Each electron-emitting device 74 is connected to a row-direction wiring 4 and a column-direction wiring 6, both consisting of electroconductive films. The wirings shown in FIG. 14 consist of n column-direction wirings 6 and m row-direction wirings 4 (also called "matrix wirings"). At the crossing region of the row-direction wiring 4 and the column-direction wiring 6 there is provided an unrepresented insulating layer to insulate the row-direction wiring 4 from the column-direction wiring.

In order to form the image display apparatus described above, it is necessary to form a plurality of the row-direction wirings 4 and the column-direction wirings 6.

For forming a plurality of the row-direction wirings 4 and the column-direction wirings 6, it is disclosed, for example in the Japanese Patent Application Laid-open No. 8-34110, to form the wiring composed of an electroconductive film by a printing technology that is relatively inexpensive and is capable of covering a large area without a vacuum apparatus or the like.

For such printing technology, there is usually employed screen printing.

In the screen printing technology, a plate having an aperture of the desired pattern is employed as a mask, and paste containing electroconductive particles such as metal particles is printed through the aperture of the mask onto a substrate constituting the object of printing and is then baked thereby obtaining an electroconductive wiring of the desired pattern.

Also in order to obtain a finer pattern or an improvement in the positional precision which are difficult to attain with the screen printing, there may also be employed a method of employing photosensitive metal paste formed by providing the paste with photosensitive property.

In the method employing such photosensitive metal paste, the photosensitive paste formed as a film on the substrate is exposed to light through a photomask having a desired wiring pattern and is then subjected to development and baking processes thereby forming an electroconductive wiring of the desired pattern.

Among the electron-emitting devices, in addition to the aforementioned surface conduction type electron-emitting device, there are also known, for example, a spint type electron-emitting device having a conical electron-emitting region, and a MIM type electron-emitting device. The electron-emitting device can be utilized as an image display device by a combination with a phosphor which emits light by the electrons emitted by such electron-emitting device. Among the image display devices, there is known, for example, an EL device in addition to the electron-emitting device. Also there is known a configuration in which a micromirror is utilized as an image display device and an image is displayed by integrating such micromirrors and controlling the light reflection by each of such micromirrors. Also there is already widely employed a configuration of utilizing liquid crystal as an image display device for displaying an image.

Another background technology is disclosed in the Japanese Utility Model Application Laid-open No. 5-38874, which discloses, for connecting mutually opposed two conductive films, a technology of superposing a resistive film with each end of the two conductive films. Also there is disclosed a technology of forming the end portion of the conductive film with a straight or curved folding line such as of a sawtooth shape, a comb-tooth shape or an undulating shape in order to prevent a rack in the resistive film at the stepped difference in the superposed region from growing into a large single crack.

Still another background technology is disclosed in the Japanese Patent Application Laid-open No. 8-315723 which discloses a configuration of forming a recess in the wiring and positioning a spacer in such recess.

SUMMARY OF THE INVENTION

Formation of a fine line, such as a wiring, consisting of a thick film for example by a printing method on a substrate is associated with the following drawbacks.

In a configuration in which the fine line is formed on the substrate, such fine line may be peeled off from the substrate.

Such phenomenon is considered to result from generation of a stress between the fine line and the substrate.

For example, in case of a wiring formed on a glass substrate is made thick, a crack may be formed in the glass substrate in a region where the end of the wiring is in contact with the substrate (such crack being hereinafter called as an end crack). Also a crack may be generated in the glass substrate in a direction parallel to the longitudinal direction of the wiring (such crack being hereinafter called a side crack).

One of the causes of such phenomena is that, in case an organic component is contained in the composition, such organic component escapes at the baking operation to induce a contraction in the volume, thereby applying a stress to the glass substrate. Another cause is assumed that a stress is applied to the glass substrate by a thermal stress resulting from the difference in the thermal expansion coefficient between the components of the paste and the glass substrate.

Such cracks are formed at the baking process or with the lapse of time thereafter.

Also there may result drawbacks that the aforementioned end crack and side crack respectively extend and are mutually connected to form a large crack or that the wiring itself becomes bent and is peeled off from the substrate.

Such situations will be explained further with reference to FIGS. 15A to 15D, schematically showing the drawbacks resulting the wiring substrate of the conventional technology. FIGS. 15A to 15D schematically show a wiring formed on a substrate, wherein FIG. 15A is a plan view, FIG. 15B is an enlarged perspective view, seen from the rear side, of a circled portion 15B in FIG. 15A, FIG. 15C is a magnified look-through view, seen from the rear side, of encircled portion 15C in FIG. 15A, and FIG. 15D is a cross-sectional view along a line 15D—15D in FIG. 15A.

The illustrated example shows a case where plural slat-shaped (line-shaped) thick film wirings 1 are formed (baked) on the glass substrate 200.

As shown in FIG. 15B (a magnified look-through view of an encircled portion 15B), side cracks 30 may be generated in the glass substrate 200, substantially parallel to the longitudinal direction of the wiring 1 and along both ends of the width thereof.

Such side crack 30 principally depends on the film thickness and the probability of crack generation becomes higher as the film thickness increases. The cross-sectional shape of the wiring is also an influencing factor. In case of employing photosensitive paste, the cross-sectional shape of the wiring is substantially trapezoidal, but the both lateral faces becomes somewhat thicker than the central portion. For this reason, there are often generated two side cracks slightly inside both ends of the width of the wiring as illustrated.

Also as shown in FIG. 15C (a magnified look-through view of an encircled portion 15C), end cracks may be generated with a shell-shaped pattern at the end of the wiring. Also such end crack 30 depends on the film thickness and the probability of crack generation becomes higher as the film thickness increases.

Also, as shown in FIG. 15D, both end portions 5 of the wiring 1 may be peeled off in a large dimension. The probability of such phenomenon becomes higher as the film thickness increases or as the number of baking process increases.

In case a stress (for example thermal expansion or contraction mentioned above or volume contraction) is applied to the wiring 1, since the wiring 1 is adhered thereto, a tensile force or the like is transmitted to the substrate 200 thus leading to a crack if the adhesive force is large or a peeling if the adhesive force is small.

The aforementioned crack or peeling of wiring tends to be generated when the film thickness after baking is at about 10 $\mu$m, and the probability of generation of such crack or peeling and the level thereof becomes higher as the film thickness increases for example to 12 $\mu$m or 18 $\mu$m.

Such end crack or peeling of wiring leads, in the lead portion of the wiring, to a drawback that a flexible circuit board or a tab cannot be mounted by peeling thereof together with the wiring at the succeeding mounting operation of such flexible circuit board or tab, or, in other portion, a drawback of shortcircuiting resulting from that the end portion of the wiring is bent up to come in contact with other portions or resulting from the chipping or dropping of the wiring, or a drawback that the shape of markers such as an alignment mark becomes unstable.

The present application discloses an invention of which an effect is to suppress the peeling of the fine line and the crack generation in the substrate.

One of the inventions relating to the substrate having the fine line of the present application is featured by:

a substrate having a fine line, wherein the fine line is provided, in at least a part in the longitudinal direction thereof, with plural recesses arranged with a gap not exceeding 200 $\mu$m.

The presence of such recess allows to disperse the stress generated in the fine line or at the interface between the fine line and the substrate.

In particular, the aforementioned plural recesses are preferably arranged in a direction crossing the longitudinal direction of the fine line (namely a direction not parallel to the longitudinal direction of the fine line, and the gap between the end of the fine line and the recess adjacent to such end does not exceed 200 $\mu$m in a direction passing through the plural recesses and perpendicular to the longitudinal direction of the fine line. Wherein, the above "plural recesses are arranged in a direction crossing the longitudinal direction of the fine line" means a configuration that the plural recesses are arranged in a sectional area along the direction crossing the longitude of the fine line. Such configuration of the structure is for example shown in FIGS. 1A, 1B, 1E and 1F.

Also in the aforementioned invention, between the recesses and/or between the end of the fine line and the recess in a direction passing through the recesses and perpendicular to the longitudinal direction of the fine line there exists a portion thicker than the thickness of the recess (namely the distance between the bottom of the recess and the surface of the substrate on which the fine line is formed), and such thickness of the recess preferably does not exceed 15 $\mu$m, more preferably 10 $\mu$m. Also the thickness of the recess is preferably at least equal to 30 nm.

Also in the aforementioned invention, there can be advantageously adopted a configuration in which the aforementioned recess is formed as a groove extending in the longitudinal direction of the fine line and a configuration in which such groove is arranged in plural units in mutually parallel manner.

The aforementioned invention can be particularly advantageously applied to a configuration where the aforementioned fine line is utilized as a wiring.

Also the aforementioned invention is particularly effective in case the fine line is obtained by applying paste-like material onto the substrate and then heating such material.

The present application also includes the following invention:
a substrate having a fine line, wherein the fine line is provided with a recess in at least a part thereof, wherein the width of the fine line in a direction passing through the recess and perpendicular to the longitudinal direction of the fine line is 200 µm or larger.

This invention may be advantageously used in combination with the foregoing inventions.

The present application further includes the following invention:
a substrate having a fine line, wherein the fine line is provided in at least a part in the longitudinal direction thereof, with plural recesses arranged in a direction crossing the longitudinal direction of the fine line.

Also this invention may be advantageously used in combination with the foregoing inventions.

In the foregoing inventions, the recess is preferably provided in all the portion of the fine line where the width of the fine line, in a direction perpendicular to the longitudinal direction thereof, is 200 µm or larger, but it may also be provided only in a particularly necessary portion such as the longitudinal end portion of the fine line. For example the longitudinal end of the fine line is apt to be subjected to an external force by a succeeding process such as connection to another member and therefore tends to generate peeling, so that the configuration having the recess of the present invention can be advantageously adopted.

Also the present application includes an invention for a configuration in which the fine line provided on the substrate is utilized as a wiring for driving an electron-emitting device. More specifically, such configuration can be realized by providing an electron-emitting device on the aforementioned substrate, electrically connecting the fine line, constituting the wiring, with the electron-emitting device and supplying a voltage for causing the electron-emitting device to emit electrons through the wiring.

Furthermore, the present application includes an invention for a configuration in which the aforementioned electron source is combined with a phosphor emitting light by the electrons emitted by the electron-emitting device to constitute an image display apparatus.

Furthermore the present application includes an invention for a method for forming a wiring on a substrate, the method comprising:
a step of forming a film of photosensitive electroconductive paste to constituting the wiring;
a step of irradiating the formed film of the electroconductive paste with light through a photomask bearing a pattern similar in shape to the recess to be formed on the surface of the wiring;
a development step after the light irradiation; and
a baking step after the development step.

Also the wiring forming method of the present invention comprises:
a step of printing conductive paste on the substrate, utilizing a plate bearing a pattern similar in shape to the recess to be formed on the surface of the wiring; and
a baking step after the printing.

Also the wiring forming method of the present invention comprises:
a step of forming a wiring on the substrate; and
a step of eliminating a part of the formed wiring thereby forming a recess.

BRIEF DESCRIPTION OF THE DRAWINGS

FIG. 2 is a schematic plan view showing a state in which a wiring is formed on a substrate;

FIGS. 3A, 3B, 3C and 3D are views showing process steps for forming a wiring on a substrate;

FIGS. 10A, 10B, 10C, 10D, 10E and 10F are views showing process steps of a wiring forming method in an example 5;

FIGS. 11A, 11B, 11C, 11D, 11E and 11F are views showing process steps of a wiring forming method in an example 6;

DETAILED DESCRIPTION OF THE PREFERRED EMBODIMENTS

Figure 1A:
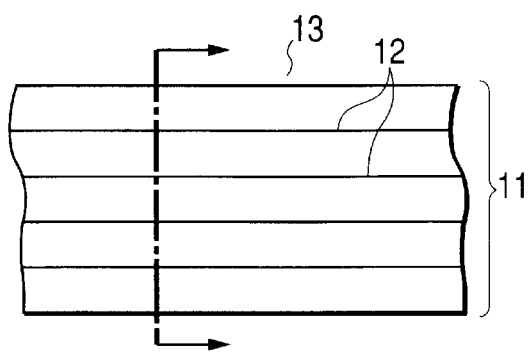
FIGS. 1A, 1B, 1C, 1D, 1E, 1F and 1G are schematic views showing wiring substrates constituting embodiments and examples of the present invention.

Now the present invention will be clarified by preferred embodiments thereof, with reference to the accompanying drawings. However the dimension, material, form and relative arrangement of the components described in such embodiments are not intended to limit the present invention to such description unless otherwise specified.

In the following embodiments, there will be described an example of providing a substrate with a wiring for driving an electron-emitting device, but the present invention is not limited to such example as explained in the foregoing.

In the following there will be explained, with reference to FIGS. 1A to 1G, an embodiment of a wiring substrate applicable for example to an electron source substrate to be employed in an image forming apparatus such as an image display apparatus. FIGS. 1A to 1G are schematic views of a wiring substrate embodying the present invention.

As shown in FIGS. 1A to 1G, the wiring substrate embodying the present invention is provided with a board 13 and a wiring 11 formed thereon, and, on the surface of the wiring 11, there is formed a groove 12 as a recess.

The "wiring" means an electroconductive structured member formed with desired width, film thickness and length on a desired base member (hereinafter "substrate" will be used in the same meaning as the substrate).

As explained in the foregoing, on the surface of the wiring 11, there is formed a notch 12 as a recess.

Such notch 12 can assume various shapes (patterns seen from above) as shown in FIGS. 1A to 1F.

The notch 12 thus formed on each wiring 11 can disperse the stress generated therein, whereby the force of the wiring acting on the substrate 13 is weakened, thereby suppressing the generation of the aforementioned side crack and end crack and also suppressing the generation of the peeling. Particularly an array of plural notches can advantageously disperse the stress.

Also, when the wiring seen from above in planar manner, the notch 12 may have a linear shape such as a continuous straight line, a broken line or a curved line, or an individually independent shape (such as a pattern of small circles). Also the direction of the notch 12 may or may not be along the longitudinal direction of the substrate. Furthermore, the cross-sectional shape (in vertical cross section) of the notch 12 may be a V shape of an acute angle, a U shape or an undulating shape.

The notch 12 is more preferably so formed that the extending direction thereof is substantially parallel to the longitudinal direction of the wiring or forms an angle not exceeding 45° with the longitudinal direction of the wiring (hereinafter "direction substantially parallel to the longitudinal direction" and "direction forming an angle not exceeding 45° with the longitudinal direction" will be collectively called "direction along the longitudinal direction") and/or that a notch does not extend from a lateral end of the wiring to the other lateral end, since the electrical conductivity is not significantly hindered in case a fine line is used as a wiring. The longitudinal direction of the fine line (wiring) means the direction of the length if the fine line has a form of a straight line. In case the fine line is curved or has a bent portion, the longitudinal direction also becomes curved or bent. Also in case the paired lateral ends of the fine line are not parallel at least in a part thereof (for example a portion where the width of the fine line varies), the direction connecting the middle points of the opposed lateral ends is considered as the longitudinal direction.

The present inventors have made intensive investigation on the gap and thickness of the notch 12. As a result, it is confirmed that the generation of the side crack or end crack in the substrate can be suppressed in case the gap of the notches is 200 $\mu$m or less and the thickness of the notch is 15 $\mu$m or less for the thickness of the wiring within a range from several micrometers to several tens of micrometers.

The "gap of notches (recesses)" means the partition (thickness of the wiring (fine line) material itself) between a notch and a notch adjacent thereto.

Also the "thickness of notch (recess)" means the distance from the surface of the substrate on which the wiring (fine line) is formed to the bottom of the notch. More specifically, it means the thickness of the wiring (fine line) material itself between the surface of the substrate and the bottom of the notch.

Furthermore, the generation of the aforementioned cracks can be suppressed with a high probability if the gap of the notches does not exceed 100 $\mu$m, more preferably 10 $\mu$m.

However, the presence of a notch in the fine line used as the wiring reduces the cross sectional area thereof, thereby increasing the resistance of the wiring. Therefore, from the standpoint of electric conductivity, the thickness of the notch is preferably as large as possible.

In consideration of the foregoing, in case of forming a thin metal film on the substrate so as not to hinder the electric conductivity, there is at least required a thickness of 30 nm for such film to serve as a continuous film capable of maintaining the electrical conductivity. Therefore the fine line can serve as a substantially continuous wiring if the thickness of the notches is 30 nm or larger over the substantially entire surface of the wiring.

Such wiring can be formed on the substrate in various methods.

An example of the preferred forming methods is a printing method utilizing photosensitive electroconductive paste.

Such method utilizing the photosensitive electroconductive paste consists of forming a film of the photosensitive electroconductive paste on the substrate, then preparing a photomask bearing patterns similar in shape to the notches, and irradiating the photosensitive electroconductive paste with light through the photomask, thereby forming the wiring with notches through subsequent steps such as development and baking.

In this method, adjustment may be made on the line width of the notch pattern on the photomask, the gap between the photomask and the photosensitive electroconductive paste formed on the base member at the light irradiation and the development condition of the photosensitive electroconductive paste to adjust the thickness of the finally formed notch within the aforementioned range.

Another example of the preferred forming methods is a screen printing method.

Such screen printing method consists of preparing in advance a plate bearing a pattern similar in shape to the notch with predetermined width and gap, then causing the plate to discharge electroconductive paste to constitute the wiring thereby forming a pattern on the substrate and forming the wiring provided with the notch through processes such as baking.

Also in this method, adjustment may be made on the line width of the notch pattern on the plate and the process conditions for example in the printing operation to adjust the thickness of the finally formed notch within the predetermined range.

As still another example of the preferred forming methods, it is also possible, after the formation of a wiring pattern without notch, to partially remove the wiring pattern for example by irradiating the wiring pattern with a laser light thereby forming the wiring with notch.

In such operation, the "wiring pattern" may be that prior to baking or that after baking.

As explained in the foregoing, the crack in the substrate or the peeling of the wiring may be generated by the baking operation, but such phenomenon may appear by only one baking or only after plural baking operations in case of forming plural film layers depending on the materials to be used. Consequently there can be a situation where the notch can be formed without any problem after the baking operation.

For example in the forming method utilizing photosensitive paste, the wiring pattern formed after the exposure with the conventional photomask without the notch pattern and the development may be subjected to the light irradiation prior to or after the baking.

Also in the screen printing method, the wiring pattern formed by printing may be subjected to the light irradiation prior to or after the baking.

Also in the aforementioned examples of wiring formation such as the method utilizing the photosensitive electroconductive paste, the screen printing method, the method of partially eliminating the wiring or a method utilizing combination thereof, in case the desired film thickness is obtained by executing the formation of the wiring in plural layers, it is also possible to form the notch from a layer positioned above the final film thickness of 30 nm or to a position above the final film thickness of 30 nm.

In the aforementioned electroconductive paste, the principal component is preferably composed of electroconductive particles such as of metal, and more preferably of a single material or mixed materials of a relatively low specific resistivity suitable for use in the wiring, such as copper or silver. The electroconductive paste employing silver particles as the electroconductive particles is advantageous since it shows satisfactory printing property and can be used without particular attention on the atmosphere of baking.

Also in the photosensitive electroconductive paste, the electroconductive paste to which the photosensitivity is to be provided is preferably similar to the aforementioned electroconductive paste.

Also the wiring of the present invention is preferably applied to a wiring substrate in which the film thickness of the wiring (fine line) is at least equal to 5 $\mu$m after baking, because the probability of generation of the aforementioned end crack or side crack becomes higher when the film thickness exceeds about 5 $\mu$m. However, the fine line of the present invention is provided with a recess and is naturally thicker in a portion other than such recess. For example, if the thickness of the recess is 10 $\mu$m, a non-recess portion adjacent thereto is thicker than 10 $\mu$m.

The wiring and wiring substrate of the aforementioned embodiment of the present invention are preferably applicable to an electron source substrate bearing plural electron-emitting devices and driving wirings therefor, formed in a large scale on a substrate, and also to an image forming apparatus utilizing such electron source substrate.

In the following there will be explained more specific examples based on the above-described embodiment.

EXAMPLE 1

The example 1 has a configuration, among the aforementioned embodiments, identical with that shown in FIGS. 1A to 1G, wherein shown a notch 12, a wiring 11 and a substrate 13.

Figure 1B:
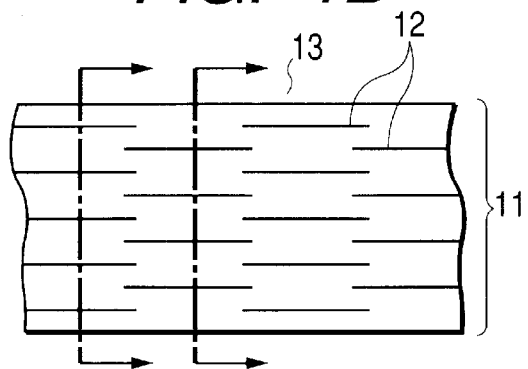
Figure 1C:
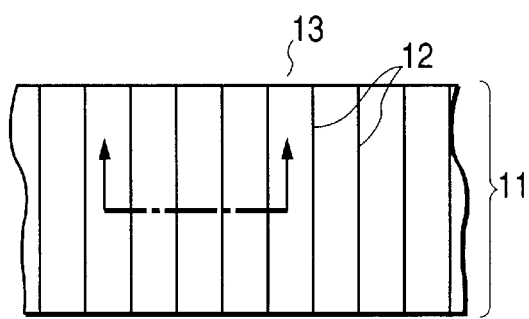
Figure 1D:
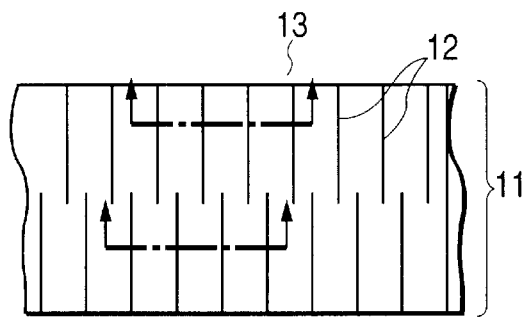
Figure 1E:
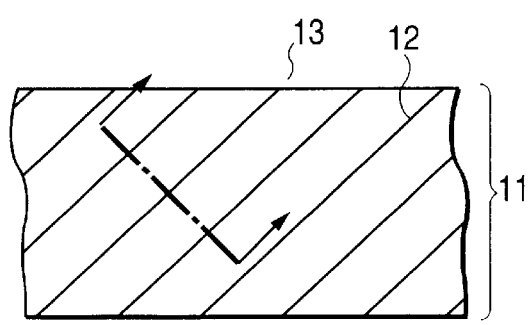
Figure 1F:
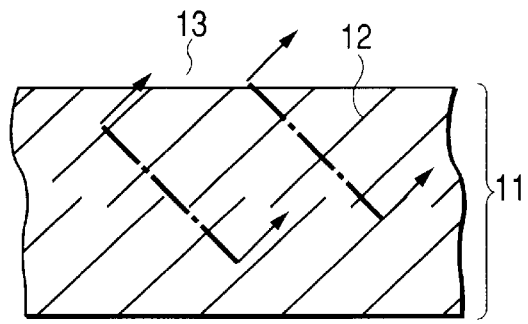

FIG. 1A shows an example in which the notch 12 is formed in continuous manner in a direction along the wiring (substantially parallel to the longitudinal direction of the wiring), FIG. 1B shows an example in which the notch 12 is formed in non-continuous manner in a direction along the wiring (substantially parallel to the longitudinal direction of the wiring), FIG. 1C shows an example in which the notch 12 is formed in continuous manner in a direction substantially perpendicular to the longitudinal direction of the wiring, FIG. 1D shows an example in which the notch 12 is formed in non-continuous manner in a direction substantially perpendicular to the longitudinal direction of the wiring, FIG. 1E shows an example in which the notch 12 is formed in continuous manner with an acute angle (45°) to the longitudinal direction of the wiring, and FIG. 1F shows an example in which the notch 12 is formed in non-continuous manner with an acute angle (45°) to the longitudinal direction of the wiring, thus representing specific examples of the wiring with notch of the present invention.

Figure 1G:
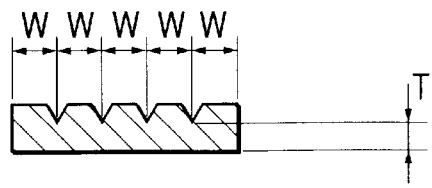

FIG. 1G is a cross-sectional view seen from a direction indicated by an arrow in each of FIGS. 1A to 1F. In FIG. 1G, the gap of the notches is represented by "W", and the thickness of the notch (distance from the substrate surface to the notch bottom as explained in the foregoing) is represented by "T".

In any of the wiring patterns in FIGS. 1A to 1F, the gap "W" of the notches is selected as 100 $\mu$m or less and the thickness is selected within a range from 30 nm to 10 $\mu$m.

In the following there will be explained, with reference to FIGS. 2 to 5B, a case of applying the wiring substrate to an image forming apparatus, namely employing it as an electron source substrate. More specifically, there will be explained a case of forming, as the wiring pattern for the image forming apparatus, a lower wiring and an upper wiring on the substrate thereby constructing a matrix wiring.

In these drawings, there are shown a wiring 11 formed on a substrate 13 and constituting the lower wiring, and a notch 12 to be formed on the surface of the wiring 11 in a manner described in the foregoing.

Also there are shown photosensitive electroconductive paste 14 used as the material for the wiring 11, an upper wiring 17, an insulation layer 16 for insulating the wiring 11 from the upper wiring 17, a screen plate 18, an exposing light 19 and a mask 23.

FIG. 2 shows a state after the formation of the wiring 11, and FIGS. 3A to 3D show the steps of formation (corresponding to a cross section along a line 3—3 in FIG. 2). FIG. 3A is a 3—3 cross-sectional view after the film formation of the photosensitive electroconductive paste on the substrate 13, FIG. 3B is a 3—3 cross-sectional view at exposure, FIG. 3C is a 3—3 cross-sectional view after development, and FIG. 3D is a 3—3 cross-sectional view after baking.

Figure 4A:
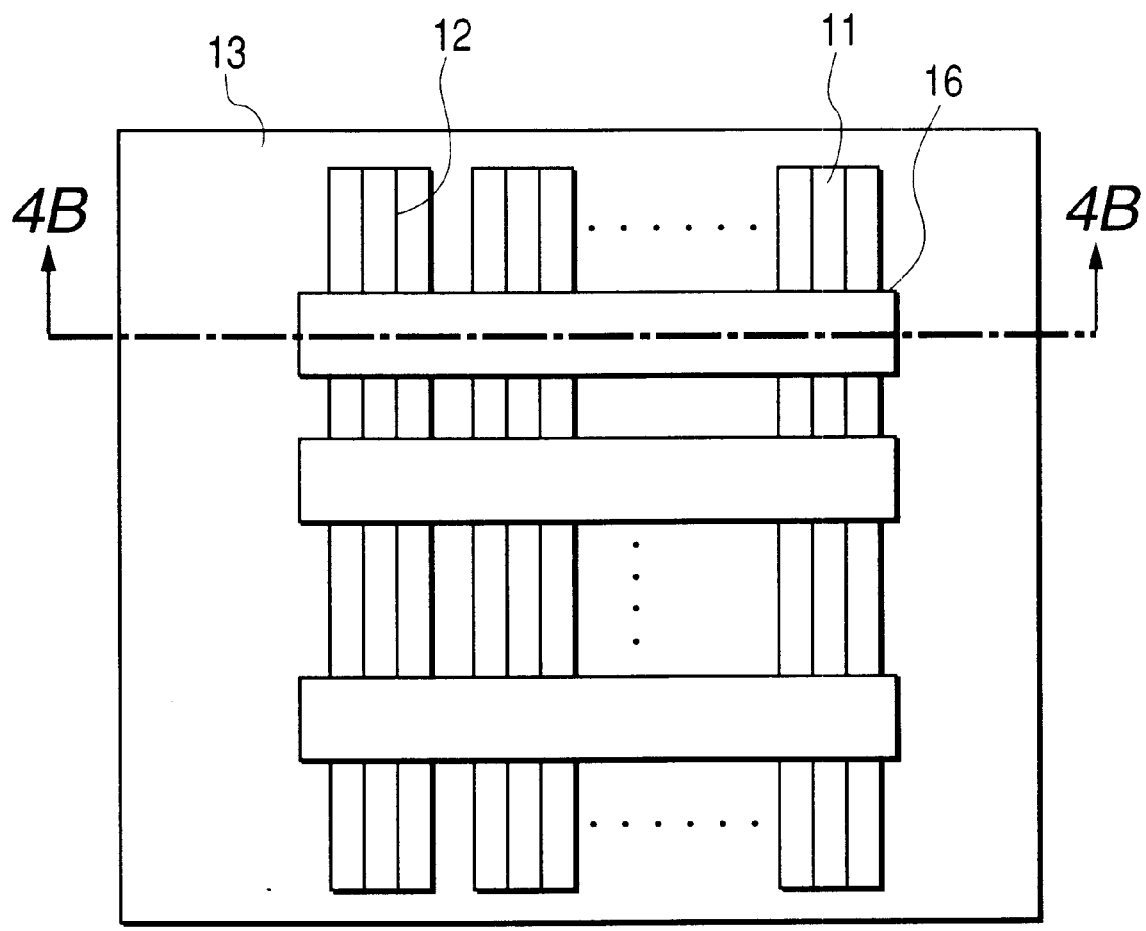
FIGS. 4A and 4B are respectively a plan view and a cross-sectional view showing a state where an insulation layer is formed.
Figure 4B:
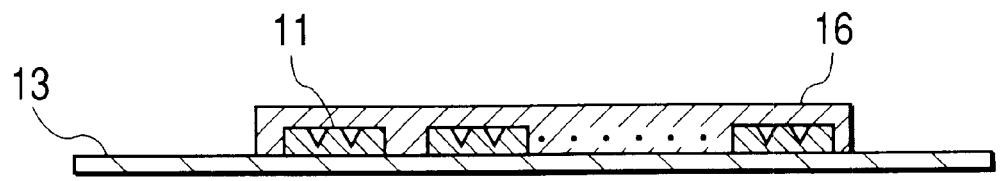
Figure 5A:
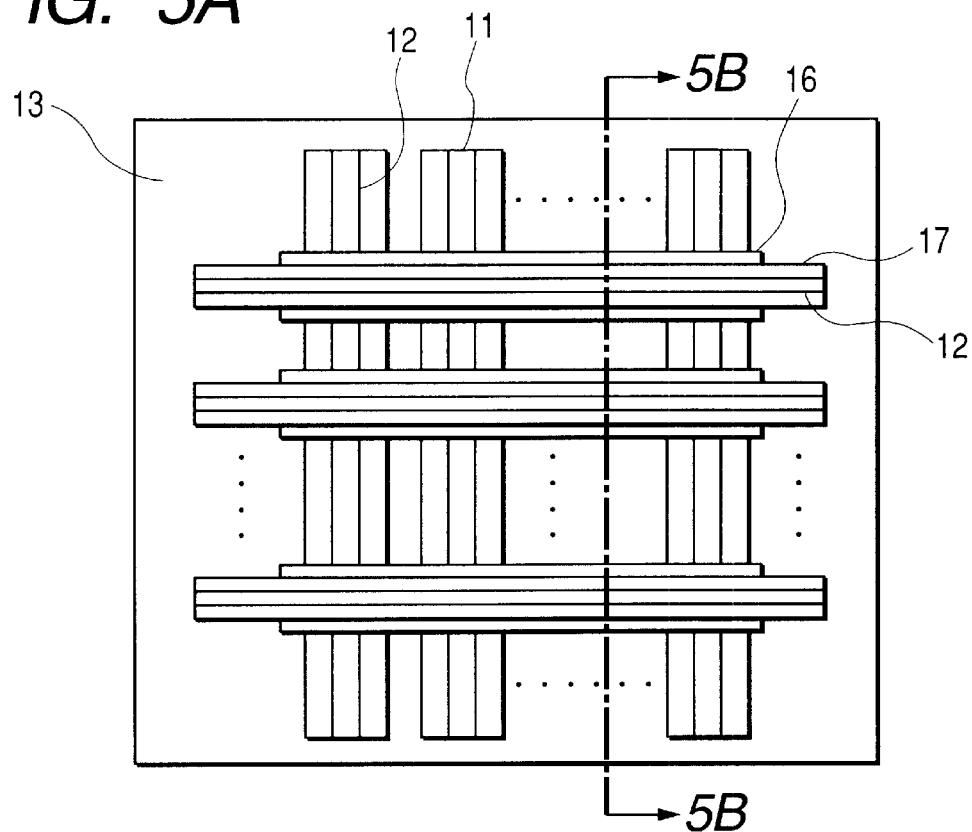
FIGS. 5A and 5B are respectively a plan view and a cross-sectional view showing a state where an upper wiring is formed.
Figure 5B:
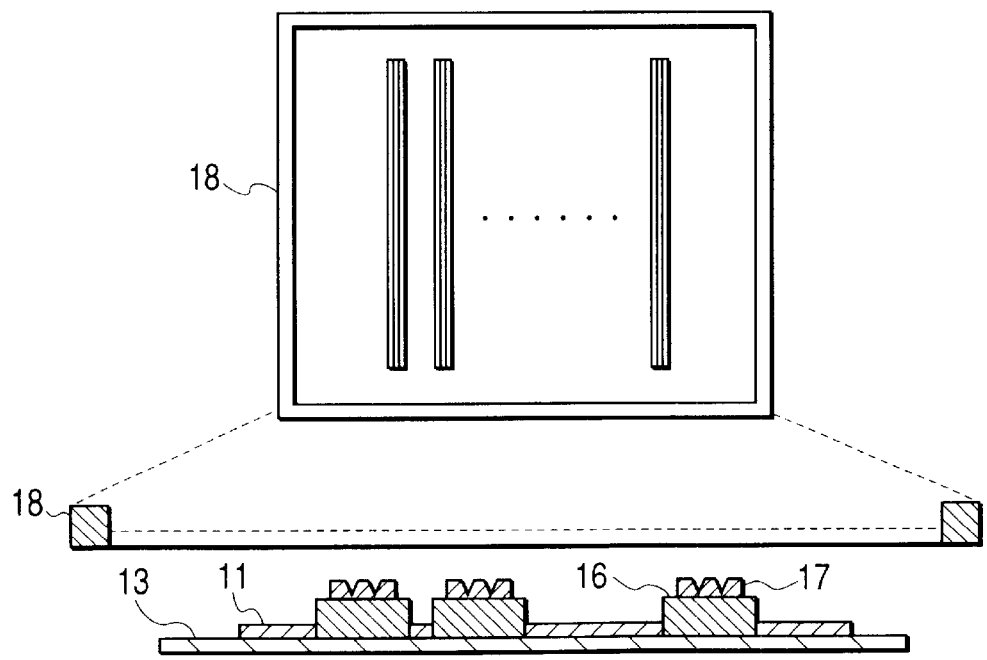

FIGS. 4A and 4B are respectively a plan view and a cross-sectional view along a line 4B—4B in FIG. 4A, showing a state after the formation of the insulation layer 16. FIGS. 5A and 5B are respectively a plan view and a cross-sectional view along a line 5B—5B in FIG. 5A, showing a state after the formation of the upper wiring 17.

At first there will be explained the method for forming the lower wiring 11 on the substrate 13.

Referring to FIG. 3A, there were prepared a soda lime glass substrate and a quartz substrate as the substrate 13, and a film of the photosensitive electroconductive paste 14 was formed by screen printing method on each substrate 13.

The photosensitive electroconductive paste 14, principally composed of silver particles, contained the silver particles in 60 to 80% and a glass component, a photosensitive material, glass frit and a solvent component in 20 to 40%.

The film was formed with a screen plate of 150 mesh. The mesh X means that the screen has X screen apertures per side in a square of a side of 25.4 mm.

Then drying was executed at about 80° C. to 150° C. in order to dry the photosensitive electroconductive paste 14. The film thickness after the drying was about 30 $\mu$m (FIG. 3A).

In the following there will be explained an exposure step with reference to FIG. 3B.

In the present example, there was employed a mask 23 having a pattern consisting of two slits of a gap of 100 $\mu$m and a line width of 20 $\mu$m, in order to form a notch 12 in the wiring pattern of a width of 300 $\mu$m as shown in FIG. 1A.

The mask is also provided, in other portions, with several trial slits of the patterns as shown in FIGS. 1B, 1C, 1D, 1E and 1F, and was so aligned as to execute exposure on desired positions, and the photosensitive electroconductive paste 14 was thus exposed to light (FIG. 3B).

In this operation, as shown in FIG. 3B, the photosensitive electroconductive paste 14 was exposed to the exposing light (laser light) through the aperture of the mask, but a portion to constitute the notch is not exposed because of the slit pattern.

Then the photosensitive electroconductive paste in the unexposed portion was removed by development. The area where the notch is to be formed was not sufficiently exposed and is therefore partly eliminated in the development, whereby the notch was formed (FIG. 3C).

Then a baking step was executed at about 500° C. As the pattern shows certain shrinkage by the baking process, there could be obtained the lower wiring 11 with a wiring width of 280 $\mu$m, a wiring height of 15 $\mu$m, a gap between notches not exceeding 100 $\mu$m and a thickness of notch not exceeding 10 $\mu$m (FIG. 3D).

Then, as shown in FIGS. 4A and 4B, photosensitive insulating paste was applied in four layers, then exposed and developed to form the insulation layer 16.

Then the upper wiring 17 was formed by a screen printing method.

In the screen printing, there were employed electroconductive paste containing silver particles in 60 to 80%, and a screen plate 18 of 150 mesh.

The screen plate 18 was provided with a pattern consisting of two slits of a gap of 100 $\mu$m and a line width of 50 $\mu$m, in order to form a notch in the wiring pattern of a width of 300 $\mu$m as shown in FIG. 1A. The plate was also provided, in other portions, with several trial slits of the patterns as shown in FIGS. 1B, 1C, 1D, 1E and 1F, and such plate was used to execute printing in the desired positions.

Then drying was executed at about 80° C. to 150° C. in order to dry the electroconductive paste. The film thickness after the drying was about 30 $\mu$m.

In the screen printing method, since the paste is discharged from the pattern of the plate, the actually printed ink becomes continuous by the ink flow at the printing and drying despite of the notch-forming slit as wide as 50 $\mu$m, thereby generating surface irregularities on the wiring pattern to form, through the baking process, the upper wiring 17 with notch as shown in FIG. 5B.

Then a baking step was executed at about 420° C. As the pattern shows certain shrinkage by the baking process, there could be obtained the upper wiring 17 with a wiring width of about 280 to 290 $\mu$m, a wiring height of about 18 $\mu$m, a gap between notches not exceeding 100 $\mu$m and a thickness of notch not exceeding 10 $\mu$m.

In this manner there were prepared, on the substrate, the lower wiring 11 with notch and the upper wiring 17 with notch positioned across the interlayer insulation layer 16, thus completing a matrix wiring.

With the wiring with notch of the present example, regardless of the kind of the substrate, namely neither of the substrates employed showed any side crack, end crack or peeling of wiring.

Also any of the patterns shown in FIGS. 1A to 1F could be formed in a similar manner, but the measured wiring resistance was lower in a notch pattern along the longitudinal direction of the wiring as shown in FIG. 1A than in a notch pattern in a substantially perpendicular pattern, and is therefore advantageous for the basic requirement of minimizing the resistance of the wiring.

EXAMPLE 2

Figure 6A:
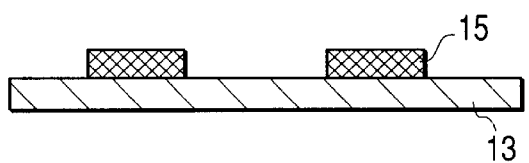
FIGS. 6A, 6B and 6C are views showing process steps of a wiring forming method in an example 2.
Figure 6B:
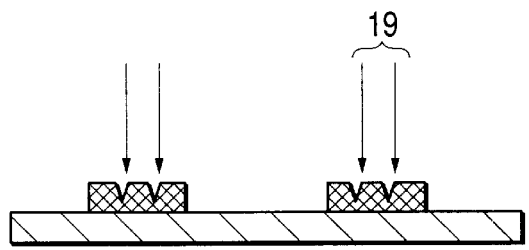
Figure 6C:
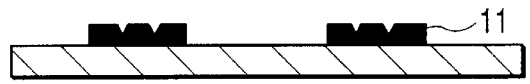

The present example shows a case of forming the wiring on the substrate in a method different from that of the example 1. FIGS. 6A to 6C show the process steps of the wiring forming method of the example 2, wherein shown are a substrate 13, a developed pattern 15, an exposing light (laser light) 19, and a completed wiring 11.

In the following there will be explained the process steps in succession. In the present example, the materials employed are same as those in the foregoing example 1, and the process is basically same, up to the development step, as that of the example 1. However the mask to be used in the exposing step was free from the slit for constituting the notch pattern. FIG. 6A shows a state after the development step in this manner.

Then, as shown in FIG. 6B, the developed pattern was subjected to irradiation with a laser light having a spot of about 10 $\mu$m. The laser light irradiation was executed so as to form notches with a gap thereof of about 100 $\mu$m and a thickness thereof of about 10 $\mu$m, utilizing a second harmonic wave (wavelength 532 nm) of a YAG laser.

Then the pattern was baked in a baking condition similar to that in the example 1 as shown in FIG. 6C thereby forming a wiring with notch. As the pattern shows certain shrinkage by the baking process, there could be obtained the wiring 11 with a wiring width of 280 $\mu$m, a wiring height of 15 $\mu$m, a gap between notches not exceeding 100 $\mu$m and a thickness of notch not exceeding 10 $\mu$m.

Then there were prepared, on thus prepared lower wiring, an interlayer insulation layer and an upper wiring with notch in a process similar to that in the example 1, thus completing a matrix wiring.

The wiring prepared in the method of the present example provided effects similar to those in the example 1. The present example also provides an advantage of forming an arbitrary notch pattern in an arbitrary position (improved precision of forming position) since the notch is formed by the laser.

Also as another method there was tried a method of preparing the notch with the laser after the baking of the wiring, and such method provided an effect of suppressing the peeling of wiring in the extended elapse of time.

EXAMPLE 3

Figure 7A:
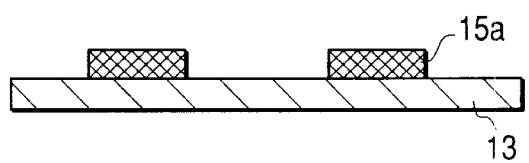
FIGS. 7A, 7B and 7C are views showing process steps of a wiring forming method in an example 3.
Figure 7B:
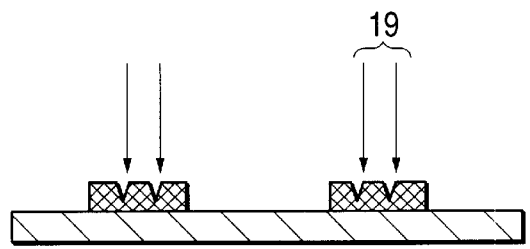
Figure 7C:
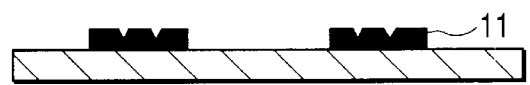

The present example shows a case of forming the wiring on the substrate in a method different from that of the example 1. FIGS. 7A to 7C show the process steps of the wiring forming method of the example 3, wherein shown are a substrate 13, a printed pattern 15a, an exposing light (laser light) 19, and a completed wiring 11.

In the following there will be explained the process steps in succession. In the present example, a print pattern 15a was printed on the substrate by a method same as that (screen printing) employed in the preparation of the upper wiring in the example 1 (FIG. 7A). However the plate used in the printing step was different from that in the example 1 and was free from the notch pattern.

Then, as shown in FIG. 7B, the print pattern was subjected to irradiation with a laser light having a spot of about 10 $\mu$m. The laser light irradiation was executed so as to form notches with a gap thereof of about 100 $\mu$m and a thickness thereof of about 10 $\mu$m, utilizing a second harmonic wave (wavelength 532 nm) of a YAG laser.

Then the pattern was baked in a baking condition similar to that in the example 1 as shown in FIG. 6C thereby forming a wiring with notch. As the pattern shows certain shrinkage by the baking process, there could be obtained the wiring 11 with a wiring width of 280 to 290 $\mu$m, a wiring height of 18 μm, a gap between notches not exceeding 100 μm and a thickness of notch not exceeding 10 μm.

Then there were prepared, on thus prepared lower wiring, an interlayer insulation layer and an upper wiring with notch in a process similar to that in the example 1, thus completing a matrix wiring.

The wiring prepared in the method of the present example provided effects similar to those in the example 1. The present example also provides an advantage of forming an arbitrary notch pattern in an arbitrary position (improved precision of forming position) since the notch is formed by the laser.

Also as another method there was tried a method of preparing the notch with the laser after the baking of the wiring, and such method provided an effect of suppressing the peeling of wiring in the extended elapse of time.

EXAMPLE 4

Figure 8:
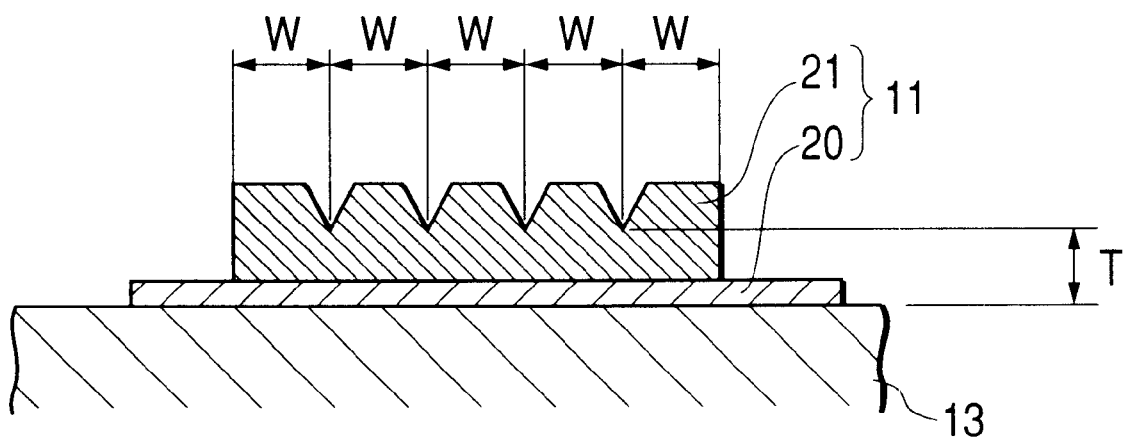
FIGS. 8 and 9 are views showing steps of a wiring forming method in an example 4.
Figure 9:
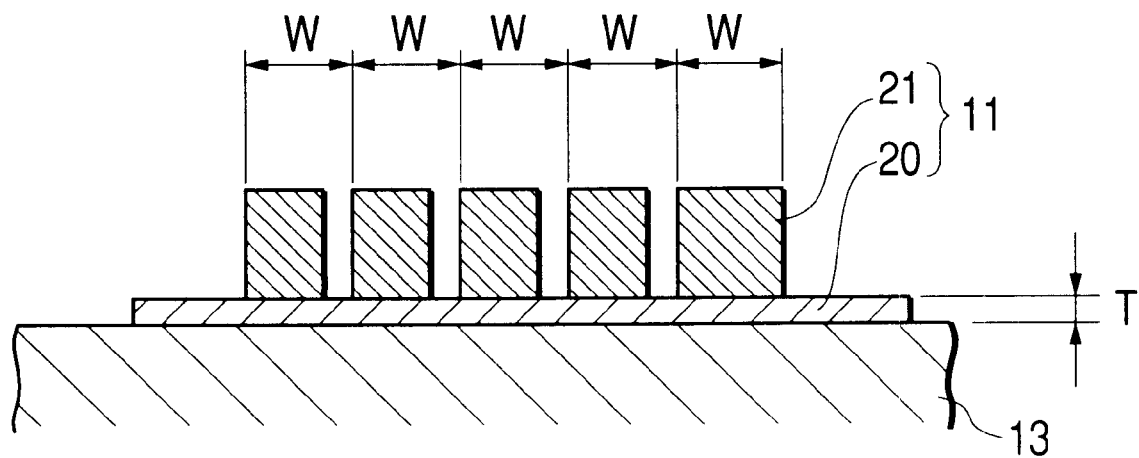

The present example shows a case of forming the wiring on the substrate in a method different from that of the example 1. FIGS. 8 and 9 show the process steps of the wiring forming method of the example 4, wherein shown are a substrate 13, a thin conductive film 20, a thick film wiring 21, and a completed wiring 11.

In the following there will be explained the process steps in succession. The present example prepares a lower wiring and an upper wiring on the substrate in a method basically same as that in the example 1, thereby forming a matrix wiring, assuming the wiring pattern of the image forming apparatus.

In the present example, in contrast to the foregoing example 1, prior to the formation of the lower wiring, a conductive thin film 20 is formed by a photolithographic thin film etching method as shown in FIGS. 8 and 9.

The conductive thin film 20 in the present example was composed of Pt of a thickness of about 50 nm with Ti as a subbing layer. The subsequent steps were conducted as in the example 1 to form a thick film wiring 21 with paste, and to complete a wiring (lower wiring) 11 by integrating the conductive thin film 20 and the thick film wiring 21. Then there were prepared an interlayer insulation layer and an upper wiring with notch in a process similar to that in the example 1, thus completing a matrix wiring on the substrate.

The matrix wiring prepared in the method of the present example, including the conductive thin film in the lower wiring, provided effects similar to those in the example 1. The present example also provides a specific advantage that the wiring is never disconnected by the notch, since the notch is stopped at the surface of the conductive thin film 20 even if the notch is formed locally over the entire thickness of the thick film wiring as shown in FIG. 9 for example by a defect in the process.

EXAMPLE 5

FIGS. 10A to 10F are views showing process steps of a wiring forming method of an example 5.

In the present example, the wiring is formed with plural layers in order to further increase the thickness of the wiring.

In the drawings, there are shown a substrate 13, a photomask 23', a photomask 23 without the notch pattern, a developed pattern 15, exposing light 19, and a completed wiring 11.

In the following there will be explained the process steps in succession. As the present example employs steps basically same as those of the example 1 (utilizing photosensitive paste), the following explanation principally describes the points different from the example 1.

In the present example, however, in order to form the wiring in two layers, there are executed in succession a film forming step (FIG. 10A), an exposure step (FIG. 10B), a film forming step (FIG. 10C) and an exposure step (FIG. 10D) and then executed are a development step (FIG. 10E) and a baking step (FIG. 10F) to form a thick film wiring.

In the present example, the first film forming step (FIG. 10A) was executed with a screen plate of 325 mesh to obtain a dried film thickness of 14 μm, and the succeeding exposure step (FIG. 10B) was conducted with the photomask 23 without the notch pattern.

Then the second film forming step (FIG. 10C) was executed with a screen plate of 325 mesh to obtain an additional dried film thickness of 22 μm or a total thickness of 36 μm, and the succeeding exposure step (FIG. 10D) was conducted with the photomask 23' having the notch pattern.

Through the subsequent development and baking steps, there was obtained a wiring with notch, having a final film thickness of 18 (=7+11) μm with a thickness of the notch of 7 μm.

As the pattern shows certain shrinkage by the baking process, there could be obtained the wiring 11 with a wiring width of 280 μm, a wiring height of 18 μm, a gap between notches not exceeding 100 μm and a thickness of notch not exceeding 10 μm.

Then there were prepared, on thus prepared lower wiring, an interlayer insulation layer and an upper wiring with notch in a process similar to that in the example 1, thus completing a matrix wiring.

The method of the present example enables the formation of the wiring of a larger film thickness, without generation of cracks in the substrate or peeling of the wiring.

EXAMPLE 6

FIGS. 11A to 11F are views showing process steps of a wiring forming method of an example 6.

In the present example, the wiring is formed with plural layers in order to further increase the thickness of the wiring.

In the drawings, there are shown a substrate 13, a photomask 23, a developed pattern 15, exposing light 19, and a completed wiring 11.

In the following there will be explained the process steps in succession. As the present example employs steps basically same as those of the examples 1 and 5 (utilizing photosensitive paste), the following explanation principally describes the points different from the examples 1 and 5.

In order to form the wiring in two layers as in the example 5, there are executed in succession a film forming step (FIG. 11A), an exposure step (FIG. 11B), a film forming step (FIG. 11C) and an exposure step (FIG. 11D) and then executed are a development step (FIG. 11E) and a baking step (FIG. 11F) to form a thick film wiring.

In the present example, the first film forming step (FIG. 11A) was executed with a screen plate of 200 mesh to obtain a dried film thickness of 22 μm, and the succeeding exposure step (FIG. 11B) was conducted with the photomask 23 having the notch pattern, similar to that in the example 1.

In this operation, the distance between the exposed article and the photomask (hereinaftere called "exposure gap") was selected at about 300 μm, in order that the notch pattern of a small line width is hardly resolved to the bottom of the exposed article.

Then the second film forming step (FIG. 11C) was executed with a screen plate of 200 mesh to obtain an additional dried film thickness of 22 μm or a total thickness of 44 μm, and the succeeding exposure step (FIG. 11D) was conducted with the photomask 23' having the notch pattern as in the example 1.

The exposure gap in this step was selected smaller than that for the first layer, being executed in a state close to the contact exposure, so as to achieve resolution to the bottom of the exposed article.

Through the subsequent development and baking steps, there was obtained a wiring with notch, having a final film thickness of 22 (=11+11) μm with a thickness of the notch of about 7 μm, wherein the notch was formed as an unresolved pattern because of the larger exposure gap in the first exposure step.

As the pattern shows certain shrinkage by the baking process, there could be obtained the wiring 11 with a wiring width of 280 μm, a wiring height of 22 μm, a gap between notches not exceeding 100 μm and a thickness of notch not exceeding 10 μm.

Then there were prepared, on thus prepared lower wiring, an interlayer insulation layer and an upper wiring with notch in a process similar to that in the example 1, thus completing a matrix wiring.

The method of the present example enables the formation of the wiring of a larger film thickness, without generation of cracks in the substrate or peeling of the wiring.

EXAMPLE 7

FIGS. 12A to 12L are views showing process steps of a wiring forming method of an example 7.

In the present example, the wiring is formed with plural layers (more specifically in four layers) in order to further increase the thickness of the wiring.

In the drawings, there are shown a substrate 12, a photomask 23, a developed pattern 15, a wiring 31 after baking, and a completed wiring 11.

In the following there will be explained the process steps in succession. As the present example employs steps basically same as those of the examples 1, 5 and 6 (utilizing photosensitive paste), the following explanation principally describes the points different from the examples 1, 5 and 6.

Figure 12A:
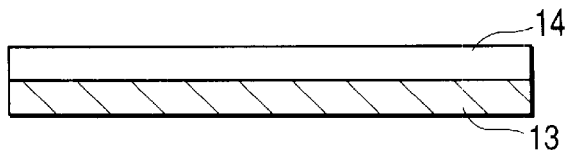
FIGS. 12A, 12B, 12C, 12D, 12E, 12F, 12G, 12H, 12I, 12J, 12K and 12L are views showing process steps of a wiring forming method in an example 7.
Figure 12B:
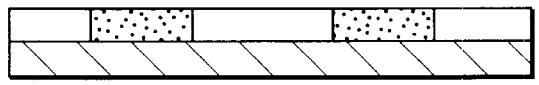
Figure 12C:
Figure 12D:
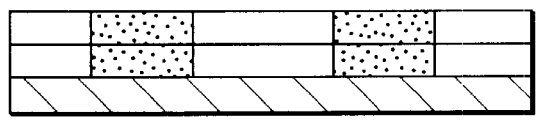
Figure 12E:
Figure 12F:
Figure 12G:
Figure 12H:
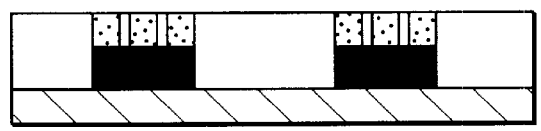
Figure 12I:
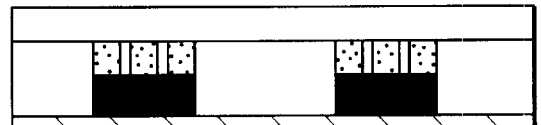
Figure 12J:
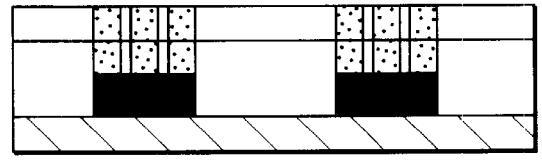
Figure 12K:
Figure 12L:
Figure 13A:
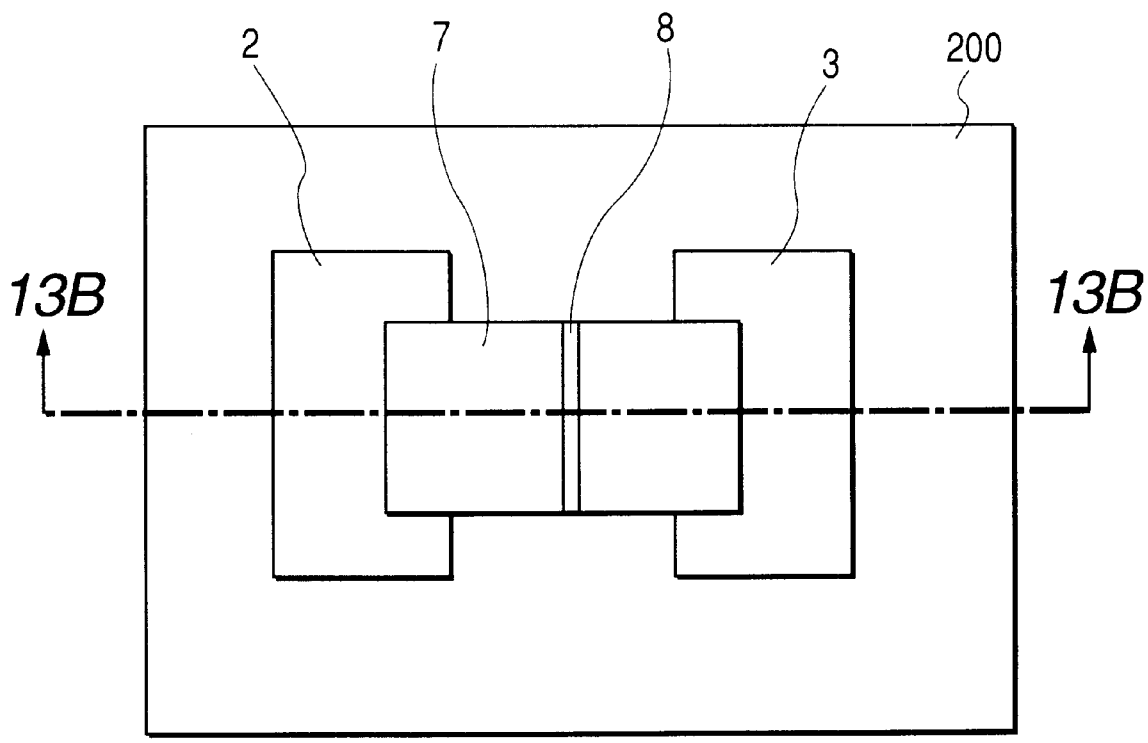
FIGS. 13A and 13B are schematic views showing an electron-emitting device.
Figure 13B:
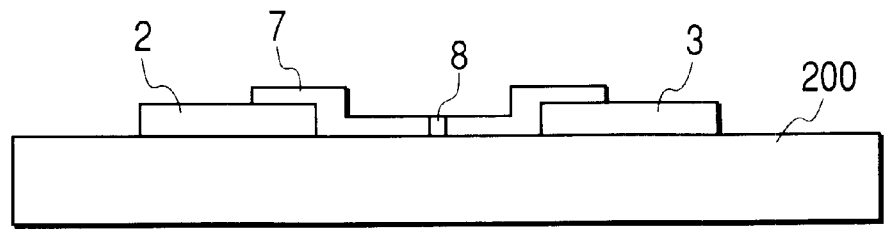
Figure 14:
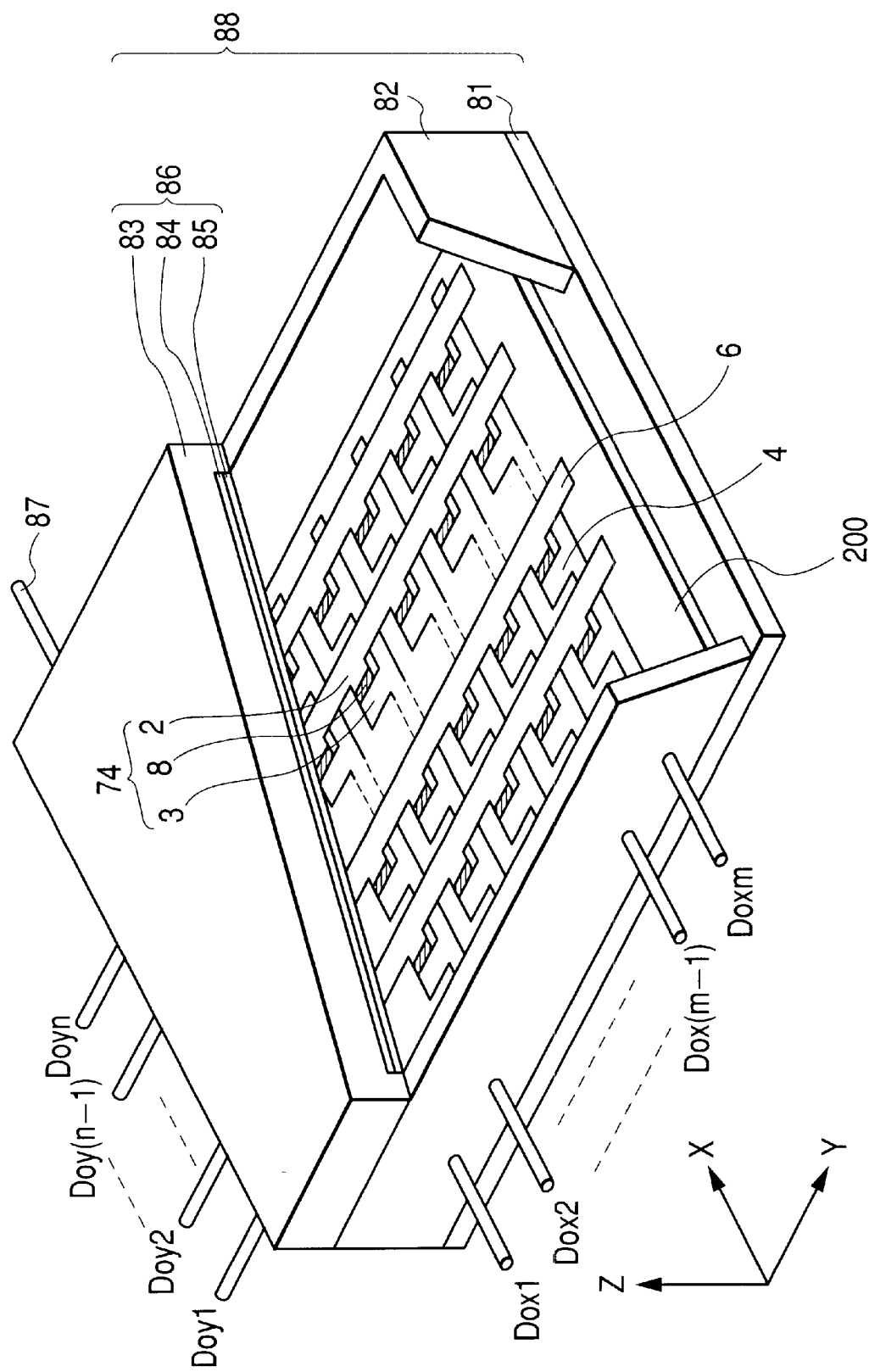
FIG. 14 is a partially cut-off perspective view of an image forming apparatus.
Figure 15A:
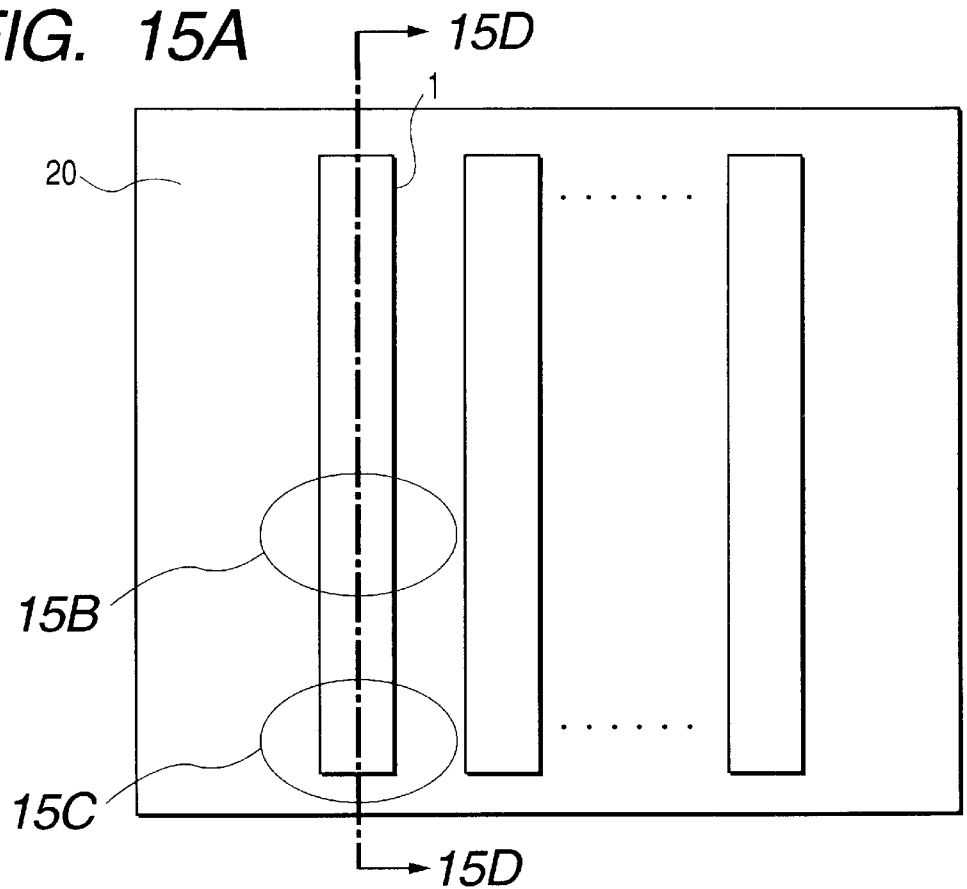
FIGS. 15A, 15B, 15C and 15D are schematic views showing the drawbacks in a wiring substrate of conventional technology.
Figure 15B:
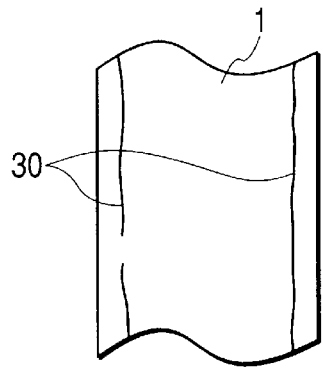
Figure 15C:
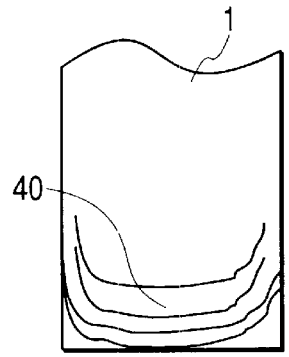
Figure 15D:
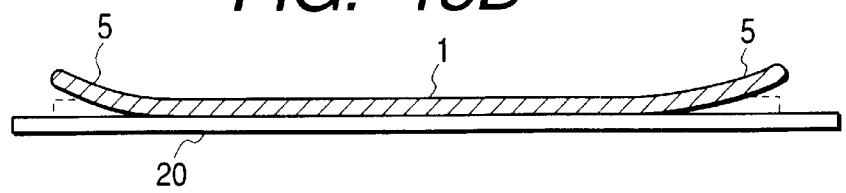

In the present example, in order to form the wiring in four layers, there are executed in succession a film forming step (FIG. 12A), an exposure step (FIG. 12B), a film forming step (FIG. 12C) and an exposure step (FIG. 12D) and then executed are a development step (FIG. 12E) and a baking step (FIG. 12F). Then there are executed a film forming step (FIG. 12G), an exposure step (FIG. 12H), a film forming step (FIG. 12I) and an exposure step (FIG. 12J) and then executed are a development step (FIG. 12K) and a baking step (FIG. 12L). In this manner there is formed a wiring thicker than in the example 5 or 6.

In the present example, the first film forming step (FIG. 12A) was executed with a screen plate of 325 mesh to obtain a dried film thickness of 14 μm, and the succeeding exposure step (FIG. 12B) was conducted with a photomask (not shown) without the notch pattern (similar to the photomask 23 of the example 5).

Then the second film forming step (FIG. 12C) was executed with a screen plate of 325 mesh to obtain an additional dried film thickness of 14 μm or a total thickness of 28 μm, and the succeeding exposure step (FIG. 12D) was conducted with a photomask (not shown) without the notch pattern (similar to the photomask 23 in the example 5).

Then the development and baking steps were executed to obtain a final film thickness after baking of 14 (=7+7) μm.

Then the third film forming step (FIG. 12G) was executed with a screen plate of 325 mesh to obtain a dried film thickness of 14 μm on the baked film of the first and second layers, and the succeeding exposure step (FIG. 12H) was conducted with a photomask (not shown) having the notch pattern (similar to the photomask 23 in the example 5).

Then the fourth film forming step (FIG. 12I) was executed with a screen plate of 325 mesh to obtain an additional dried film thickness of 14 μm or a total thickness of 28 μm on the baked film of the first and second layers, and the succeeding exposure step (FIG. 12J) was conducted with a photomask (not shown) having the notch pattern (similar to the photomask 23' in the example 5).

Then the development and baking steps (FIGS. 12K and 12L) were executed to obtain a final film thickness after baking of 28 (=7+7+7+7) μm.

In the present example, the thickness of the notch is determined at the interface between the third layer formed with the mask having the notch pattern and the second layer formed with the mask without the notch pattern, and there could be formed a wiring with a thickness of the notch of about 14 μm.

As the pattern shows certain shrinkage by the subsequent baking process, there could be obtained the wiring 11 with a wiring width of 280 μm, a wiring height of 22 μm, a gap between notches not exceeding 100 μm and a thickness of notch not exceeding 15 μm.

Then there were prepared, on thus prepared lower wiring, an interlayer insulation layer and an upper wiring with notch in a process similar to that in the example 1, thus completing a matrix wiring.

The method of the present example enables the formation of the wiring of a larger film thickness, without generation of cracks in the substrate or peeling of the wiring.

In particular, since the film thickness is increased by film formation with plural layers employing a screen plate of 325 mesh providing a relatively limited film thickness in a single film formation, the crack formation in the substrate is reduced even at a relatively large film thickness in comparison with a case where the same film thickness is formed with a smaller number of film formations with a screen plate of 200 or 150 mesh, so that the crack generation is substantially zero even at a thickness of notch of 14 μm as in the present example.

Such result is presumably ascribable to a smaller strain energy resulting from the shrinkage at the baking, due to a smaller volume of the wiring at the baking step.

EXAMPLE 8

In the following there will be explained an example of applying the aforementioned wiring substrate to an image display apparatus. In the present example 8, there were prepared an electron source substrate and an image display apparatus utilizing surface conduction electron-emitting devices.

The wiring in the present example was provided with line-shaped notches substantially parallel to the longitudinal direction of the wiring as schematically shown in FIG. 1A, in which shown are a notch 12, a wiring 11 and a substrate 13. FIG. 1G is a schematic cross-sectional view in a portion indicated by an arrow in FIG. 1A. In FIG. 1G, W indicates the gap of the notches, and T indicates the thickness (distance from the surface of the substrate to the bottom of the notch) of the notch.

The notches were so prepared that the gap "W" does not exceed 100 μm, and the thickness is without a range from 30 nm to 10 μm.

In the following there will be explained, with reference to FIGS. 3A to 3D, 16A, 16B, 17A, 17B, 18A, 18B and 19, the process for preparing the electron source substrate and the image forming apparatus of the present example.

Step 1

Figure 16A:
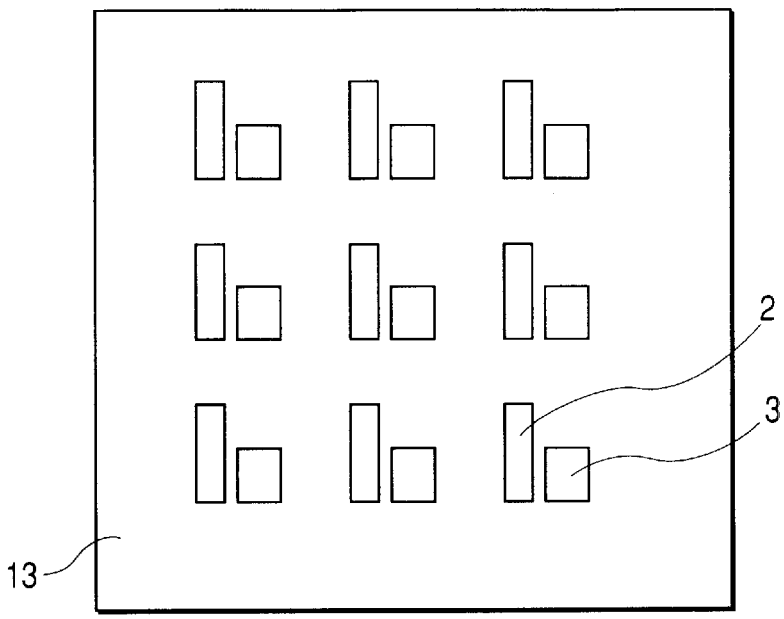
FIGS. 16A, 16B, 17A, 17B, 18A and 18B are views showing producing processes for an electron source substrate.

As shown in FIG. 16A, on a sufficiently rinsed glass substrate 13, paired electrodes 2, 3 were formed in 1000 sets in the X direction and 5000 sets in the Y direction.

However, in FIGS. 16A to 18B, for the purpose of simplicity, the electron-emitting devices are illustrated only in 9 units, namely 3 units in the X direction and 3 units in the Y direction.

In the present example, the electrodes 2, 3 were composed of platinum. The electrodes 2, 3 were prepared with a photolithographic method with a gap of 20 μm therebetween.

Step 2

On the entire surface of the substrate 13 or 200 constituting a rear plate bearing the electrodes 2, 3, photosensitive paste was coated and dried in the same manner as in the example 1 to form a layer of the photosensitive electroconductive paste (photosensitive electroconductive paste 14) (cf. FIG. 3A).

The photosensitive electroconductive paste employed in the present example was similar to that in the example 1 and contained Ag particles as the conductive material, acrylic resin constituting a photosensitive organic material to be hardened by reaction with ultraviolet light, glass filler etc.

Step 3

Then, as in the example 1, the dried layer (photosensitive electroconductive paste 14) was irradiated (exposed) with ultraviolet exposing light 19 through the light-shielding mask 23 having plural striped apertures (cf. FIG. 3B).

Step 4

Then the substrate 13 constituting the rear plate was rinsed with an organic solvent to eliminate (development) of the unexposed portion of the photosensitive electroconductive paste layer 14, whereby a developed pattern was formed (cf. FIG. 3C). The developed pattern had notches formed as shown in FIG. 3C.

Step 5

Figure 16B:
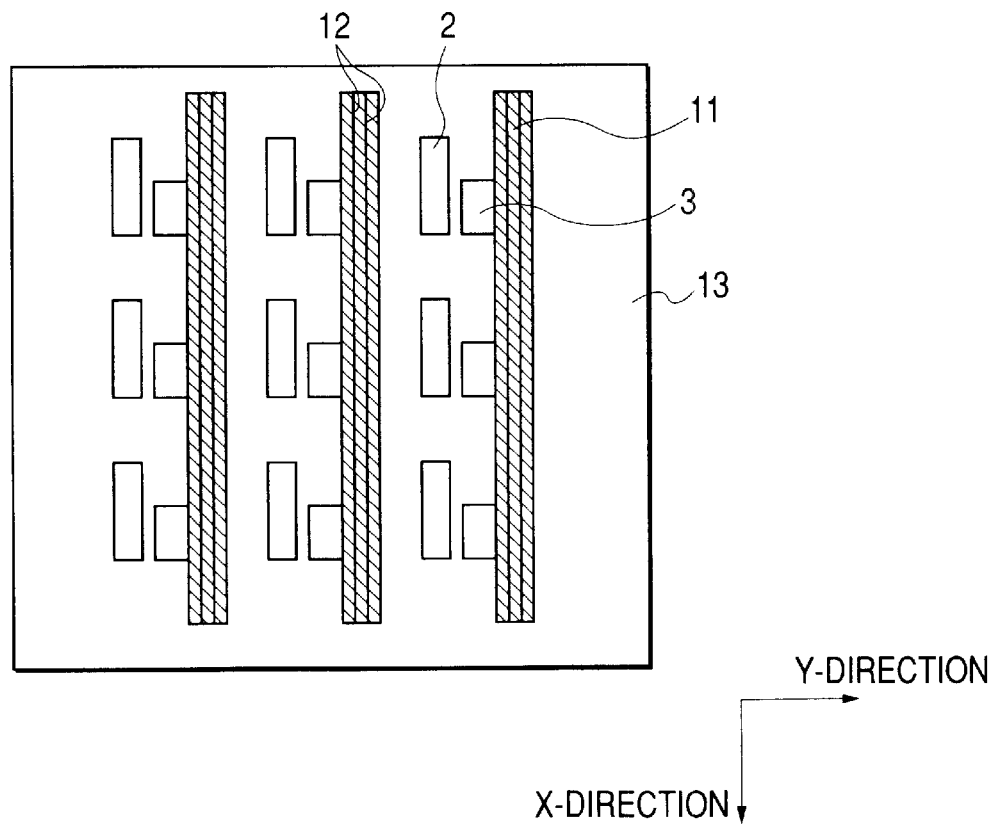

Then the rear plate was baked to form 5000 lower wirings 11, each having plural notches 12, as shown in FIGS. 3D and 16B. In this step, the row-direction wiring (lower wiring) 11 covers a part of the electrode 3, whereby achieving electrical connection of the electrode 3 and the row wiring 6. The lower wiring 11 had a height of 15 μm, a gap W of 40 μm between the notches and a thickness T of the notch of 6 μm.

Step 6

Figure 17A:
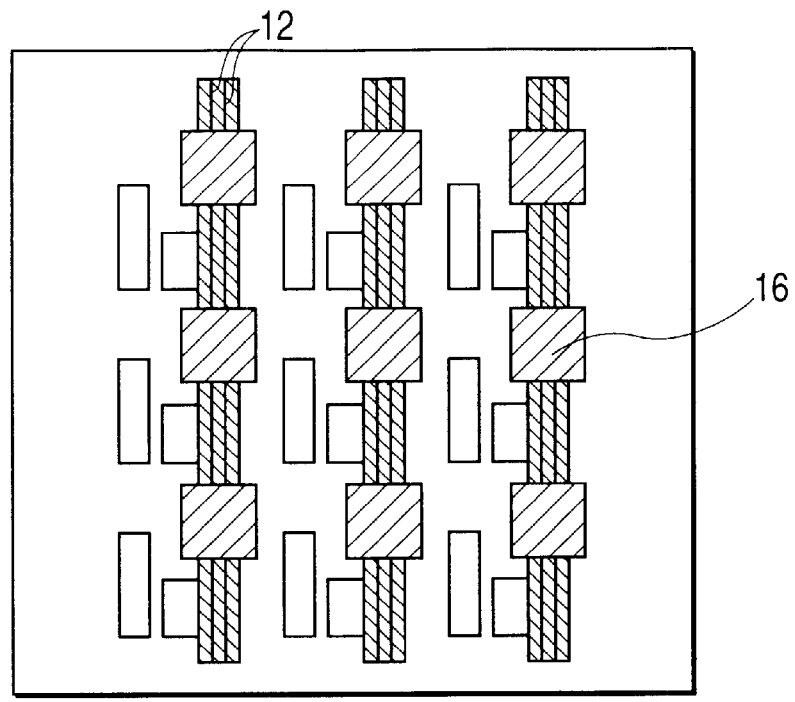

Then insulating paste containing glass particles and a binder was coated by the screen printing method on each crossing point of the already formed column wiring 11 and the row wiring (upper wiring) 17 to be formed in a next step and baked to form the insulation layer 16 (FIG. 17A).

Step 7

Figure 17B:
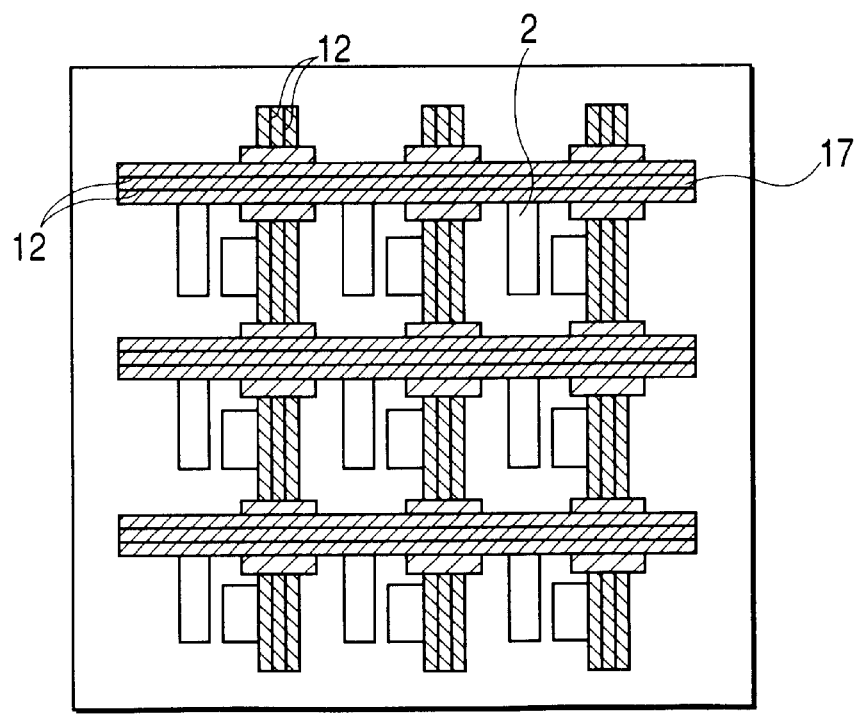

Then paste containing Ag particles and a glass binder was coated in a line pattern by the screen printing method as in the example 1 and was baked to form 1000 row wirings 17 each having plural notches 12 (FIG. 17B). In this step the row wiring 17 covers a part of the electrode 2 thereby forming connection between the electrode 2 and the tow wiring 17.

The screen printing in the step 7 was conducted with a screen plate 18 of 150 mesh (cf. FIG. 3C). The screen plate 18 was provided with two slits of a gap of 100 μm as a pattern for forming the notches.

In this manner there were prepared, on the substrate 13, the lower wirings 11 with notches, the insulation layer 16 and the upper wirings 17 with notches, thus constituting a matrix wiring.

Step 8

Figure 18A:
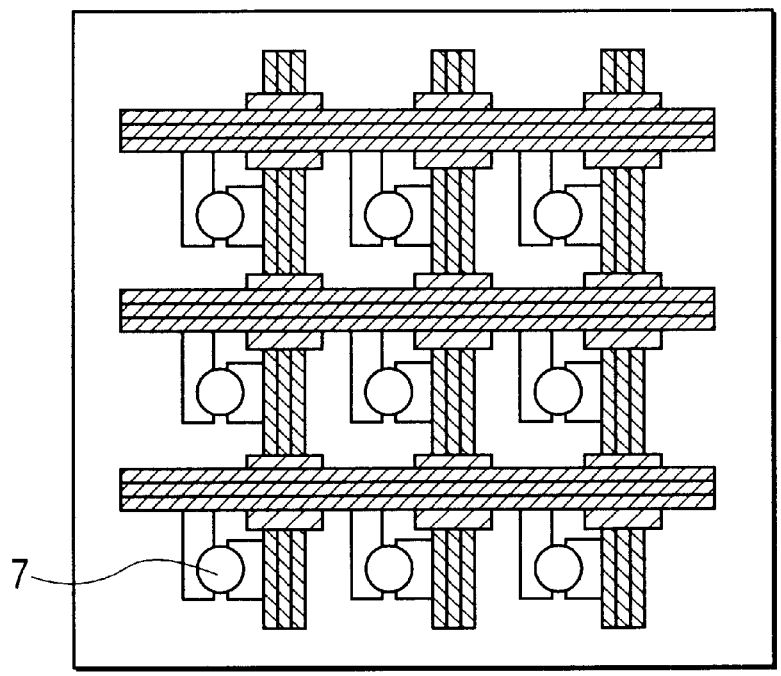

Then, aqueous solution containing Pd (hereinafter called ink) was applied to the gaps between all the electrodes 2 and 3, and was baked in the air of 350° C. to form an electron-emitting electroconductive film 7 consisting of PdO (FIG. 18A).

In the present example, the aforementioned ink was applied by an ink jet apparatus of piezo type, which is one of the ink jet methods. Also the present example employed, as the Pd-containing ink, aqueous solution containing 0.15% of an organic Pd compound, 15% of isopropyl alcohol, 1% of ethylene glycol and 0.05% of polyvinyl alcohol.

Through the above-described steps, there was prepared an electron source substrate (rear plate) prior to forming.

Step 9

The electron source substrate prior to forming, prepared in the preceding step, was placed in a vacuum chamber, and, after the interior of the chamber was evacuated to a pressure of $10^{-4}$ Pa, there was executed a "forming step" of maintaining the column wirings 6 at 0V while applying a pulse voltage in succession to the row wirings 4 under the introduction of hydrogen, thereby causing a current in each electron-emitting conductive film 7 and forming a gap in a part thereof.

In the forming step, a constant voltage pulse of 5 V was applied in repetition.

The voltage had a triangular wave form having a pulse width of 1 msec and a pulse interval of 10 msec. The electric forming process was terminated when the resistance of the electron-emitting conductive film 7 reached 1 MΩ.

Step 10

The device after the forming step was subjected to an activation step.

Figure 18B:
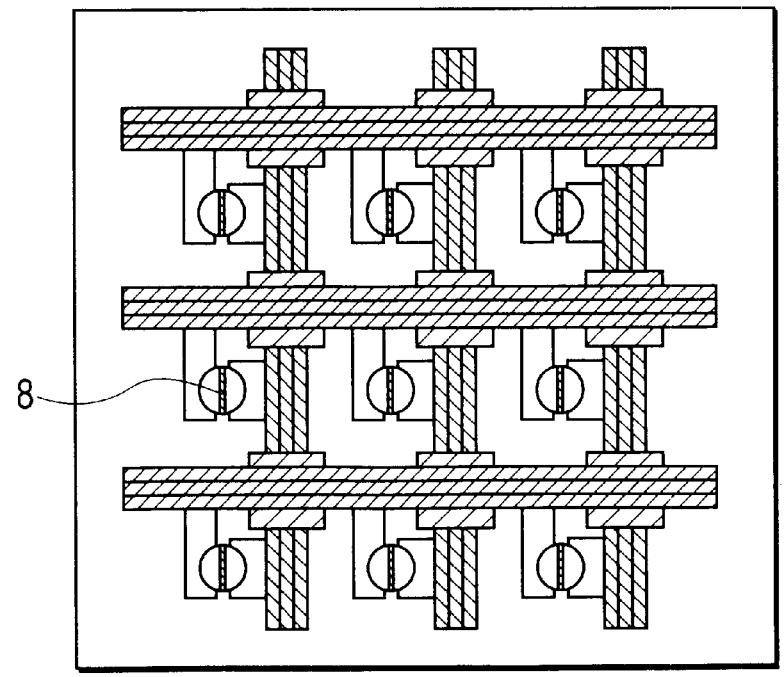

More specifically, after the interior of the chamber was evacuated to a pressure of $10^{-6}$ Pa, there was executed an "activation step" by maintaining the column wirings 6 at 0 V while applying a pulse voltage in succession to the row wirings 4 under the introduction of benzonitrile with a pressure of $1.3 \times 10^{-4}$ Pa. This step formed a carbon film in the gap of the electron-emitting conductive film 7 formed by the forming step and on the films in the vicinity of the gap, thereby forming an electron-emitting region 8 (FIG. 18B).

In the activation step, a rectangular pulse voltage with a pulse height of 15 V, a pulse width of 1 msec and a pulse interval of 10 msec.

Through the above-described steps, there was prepared an electron source substrate (rear plate) bearing a plurality of electron-emitting devices.

The evaluation of the electrical properties of such electron source substrate proved sufficient insulation between the lower wiring 11 and the upper wiring 17.

Figure 19:
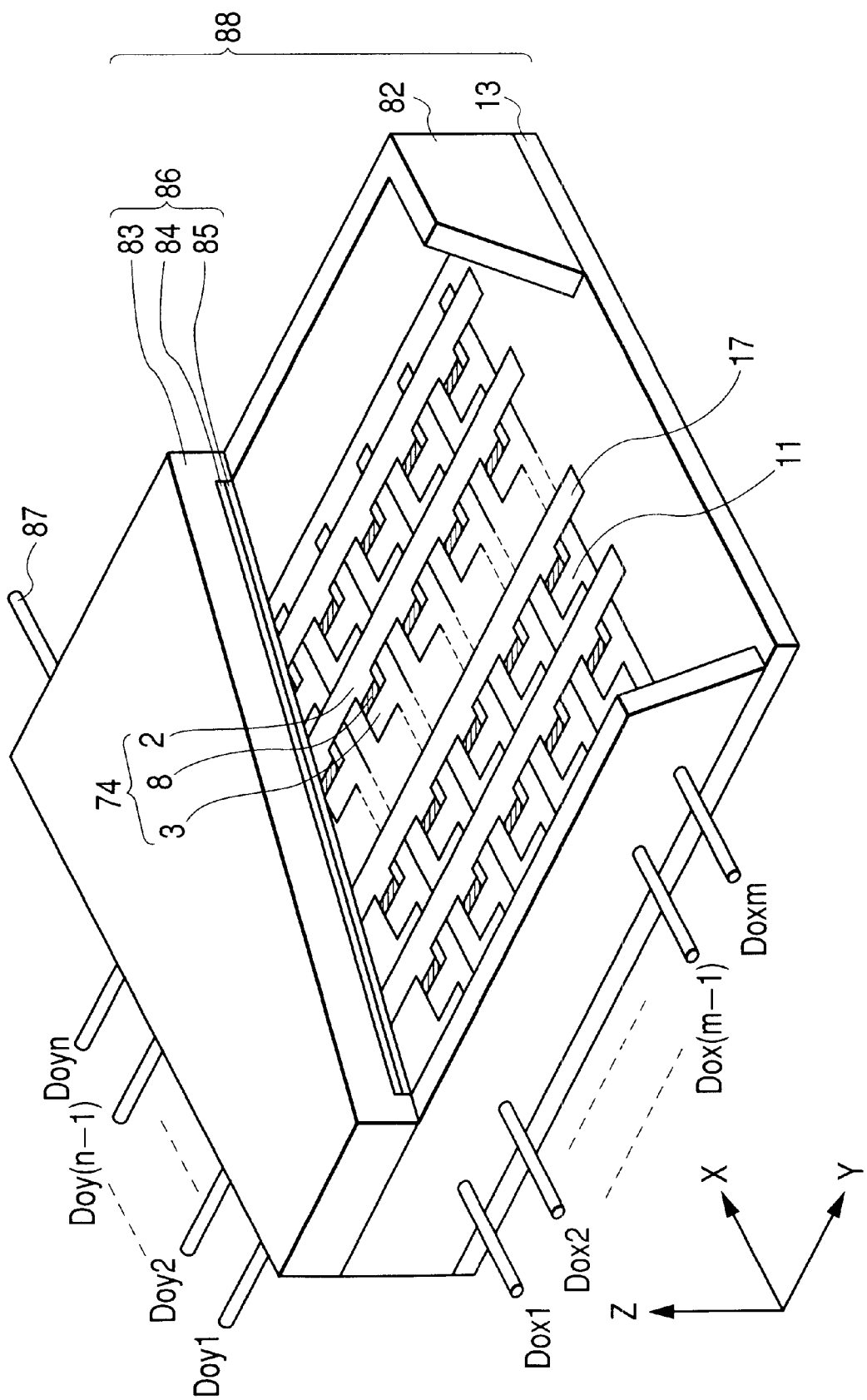
FIG. 19 is a partially cut-off perspective view of an image forming apparatus.

In the following there will be explained the method for preparing a face plate 86 shown in FIG. 19.

Step 11

At first a face plate substrate 83 composed of a material same as that of the substrate 13 for the rear plate was sufficiently rinsed and dried. Then a black member was formed on the substrate 83 by a photolithographic process.

The black member was formed in such a grating manner as to have an aperture corresponding to a portion where the phosphor of each color is positioned. The black member has a pitch in the Y direction same as that of the column wirings 6, and has a pitch in the X direction same as that of the row wirings 4.

Step 12

Phosphors of red, blue and green colors are formed by the screen printing method in the apertures of the black member.

Step 13

On the black member and the phosphors, there was formed a filming layer, by coating solution of polymethacrylate resin in an organic solvent by the screen printing method and by drying.

Step 14

On the filming layer, an Al layer was formed by evaporation.

Step 15

Then the face plate 86 was heated to eliminate the resin contained in the phosphor paste and the filming layer, thereby obtaining a face plate 86 in which an image forming member 84, which is a phosphor layer consisting of the phosphors and the black member, and a metal back 85 were formed on the substrate 83.

Step 16

Between the substrate 200 of the rear plate formed by the aforementioned steps and the face plate 86, there were positioned an outer frame 82 provided in advance with a spacer (not shown) and a jointing member.

Then, after the face plate 86 and the substrate 200 of the rear plate were sufficiently aligned, heat and pressure were applied in vacuum to soften the jointing member, thereby adjoining the constituent members. Such step provided an envelope (display panel) 88 constituting, as shown in FIG. 19, an image forming apparatus of which the interior is maintained in high vacuum.

At the end portions of the wirings 11, 17 extracted from the interior of thus obtained display panel 88, there was connected a drive circuit through a flexible cable, and a moving image was displayed by line-sequential scanning.

In such moving image display with the display panel 88, an image of a very high definition and a high luminance was obtained over a prolonged period. Also in the connection of the flexible cable to the lead portions of the upper wirings 17 and the lower wiring 11, there was not generated any defect in the wiring. Also there was not generated any pixel defect presumably resulting from a discharge phenomenon.

As explained in the foregoing, the use of the wiring substrate explained above allowed to suppress the generation of the end crack, side crack and peeling of wiring.

Therefore, in the lead portion of the wirings, there could be prevented the drawback that a flexible circuit board or a tab cannot be mounted by peeling thereof together with the wiring at the succeeding mounting operation, and also in other portions, the drawback of shortcircuiting with other portions could be avoided because the end portion of the wiring is no longer bent up, and also because the wiring is no longer chipped nor drops, and also the drawback of instability in the shape of markers such as an alignment mark was also avoided. Furthermore, also in a portion distant from the end of the substrate, the wiring is not peeled off and becomes floating from the substrate because the substrate no longer generates cracks, whereby the reliability of the product is significantly improved.

EXAMPLE 9

In the foregoing examples, the recesses are formed in the substantially entire area of the wiring in the longitudinal direction thereof. In the present example, the recesses are formed only in a part of the wiring in the longitudinal direction thereof, particularly in the end portions in the longitudinal direction.

Figure 20:
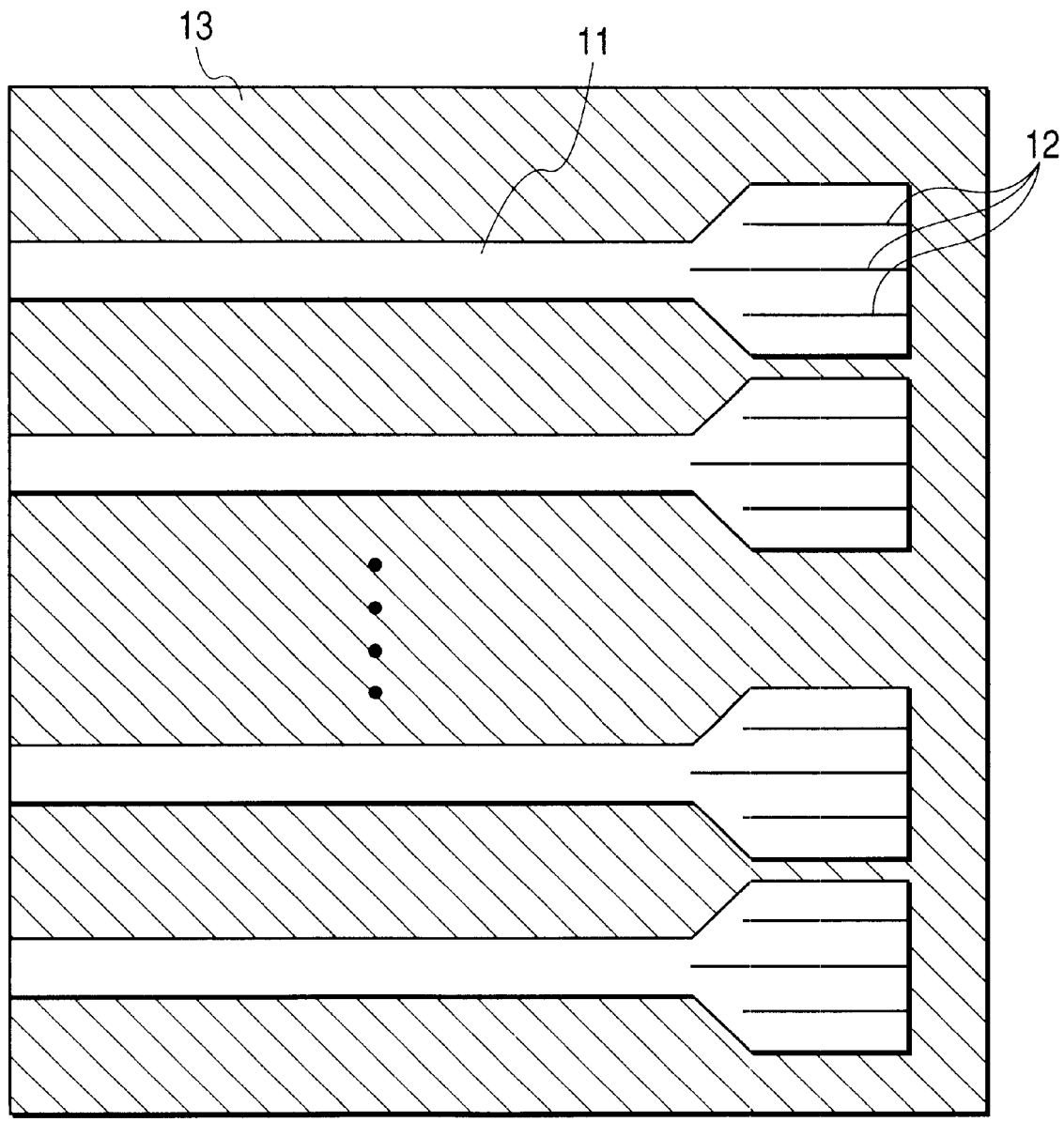
FIG. 20 is a view showing the configuration in which a recess is formed in the lead portion of a wiring.

FIG. 20 shows an example of such configuration.

In FIG. 20, there are shown a substrate 13, a wiring 11, and a notch 12 provided therein. In order to reduce the resistance, the wiring 11 is made wider in the vicinity of the end portion (lead portion of the wiring) than in the central portion. The width of the wiring 11 at the central portion is 90 $\mu$m, and expands on both sides with an angle of 45° to reach 300 $\mu$m at the end portion. Except for the vicinity of the end portion, the recess is not provided because the wiring is narrower and is less apt to generate peeling. In the vicinity of the end portion, three notches are so provided as to equally divide the width of the end portion. The wiring has a thickness of 18 $\mu$m except for the notch portion and a thickness of 7 $\mu$m in the notch portion.

As shown in this example, the recesses may be suitably positioned only in the necessary positions.

OTHER EXAMPLES

In the foregoing there have been explained example of forming the wiring on the substrate, but the present invention is also applicable to other forms such as a rib to be formed on a substrate.

As explained in the foregoing, the present invention allows to suppress generation of a crack in the substrate or of peeling of the fine line, by providing the surface of the fine line with a recess for dispersing the internal stress.

What is claimed is:

1. A substrate having a fine line, wherein said fine line comprises plural recesses arranged at intervals not exceeding 200 $\mu$m, at least in a part in the longitudinal direction of said fine line.

2. A substrate according to claim 1, wherein said plural recesses are arranged in a direction crossing the longitudinal direction of said fine line.

3. A substrate according to claim 1, wherein the distance between the end of said fine line and a recess adjacent to said end does not exceed 200 $\mu$m in a direction passing through said plural recesses and perpendicular to the longitudinal direction of said fine line.

4. A substrate according to claim 1, wherein said recess has a thickness not exceeding 15 $\mu$m.

5. A substrate according to claim 1, wherein said recess is a groove extending in the longitudinal direction of said fine line.

6. A substrate according to claim 1, wherein said fine line is a wiring.

7. A substrate according to claim 1, wherein said recess does not extend from a lateral end of said fine line to the other lateral end thereof in a direction crossing the longitudinal direction of said fine line.

8. A substrate according to claim 1, wherein said fine line is obtained by providing the substrate with paste-like material and then heating said material.

9. A substrate having a fine line, wherein said fine line comprises a recess at least in a part of said fine line and has a width at least equal to 200 $\mu$m in a direction passing through said recess and perpendicular to the longitudinal direction of said fine line.

10. A substrate having a fine line, wherein said fine line comprises plural recesses arranged in a direction crossing the longitudinal direction of said fine line, in at least a part in the longitudinal direction of said fine line.

11. An electron source comprising a substrate according to any of claims 1 to 10 and an electron-emitting device, wherein said fine line is used as a wiring for driving said electron-emitting device.

12. An image display apparatus comprising a substrate according to any of claims 1 to 10, an electron-emitting device and a phosphor for emitting light by electrons emitted by said electron-emitting device, wherein said fine line is used as a wiring for driving said electron-emitting device.

* * * * *